(12) United States Patent
Yang et al.

(10) Patent No.: US 11,367,723 B2
(45) Date of Patent: Jun. 21, 2022

(54) SEMICONDUCTOR DEVICES AND METHOD OF MANUFACTURING THE SAME

(71) Applicant: SAMSUNG ELECTRONICS CO., LTD., Suwon-si (KR)

(72) Inventors: Jung-Gil Yang, Hwaseong-si (KR); Geum-Jong Bae, Suwon-si (KR); Dong-Il Bae, Seongnam-si (KR); Seung-Min Song, Hwaseong-si (KR); Woo-Seok Park, Ansan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 84 days.

(21) Appl. No.: 17/037,807

(22) Filed: Sep. 30, 2020

(65) Prior Publication Data

US 2021/0028173 A1 Jan. 28, 2021

Related U.S. Application Data

(63) Continuation of application No. 16/534,070, filed on Aug. 7, 2019, now Pat. No. 10,923,476, which is a (Continued)

(30) Foreign Application Priority Data

Dec. 16, 2016 (KR) .................. 10-2016-0172883

(51) Int. Cl.
*H01L 27/092* (2006.01)
*H01L 29/06* (2006.01)
(Continued)

(52) U.S. Cl.
CPC .... *H01L 27/0924* (2013.01); *H01L 21/82385* (2013.01); *H01L 21/823456* (2013.01);
(Continued)

(58) Field of Classification Search
CPC ......... H01L 27/0924; H01L 21/823456; H01L 21/823468; H01L 21/82385;
(Continued)

(56) References Cited

U.S. PATENT DOCUMENTS 7,648,883 B2   1/2010 Park
9,362,355 B1   6/2016 Cheng et al.
(Continued)

FOREIGN PATENT DOCUMENTS

KR   1020150019091 A   2/2015

OTHER PUBLICATIONS

C.-H Jan, "A 14 nm SoC Platform Technology Featuring 2nd Generation Tri-Gate Transistors, 70 nm Gate itch, 52 nm Metal Pitch, and 0.049 um SRAM cells, Optimized for Low Power, High Performance and High Density SoC Products," 2015 Symposium on VLSI Technology Digest of Technical Papers.

*Primary Examiner* — Tong-Ho Kim
(74) *Attorney, Agent, or Firm* — Volentine, Whitt & Francos, PLLC

(57) ABSTRACT

A semiconductor device includes a first transistor in a first region of a substrate and a second transistor in a second region of the substrate. The first transistor includes multiple first semiconductor patterns; a first gate electrode; a first gate dielectric layer; a first source/drain region; and an inner-insulating spacer. The second transistor includes multiple second semiconductor patterns; a second gate electrode; a second gate dielectric layer; and a second source/drain region. The second gate dielectric layer extends between the second gate electrode and the second source/drain region and is in contact with the second source/drain region. The first source/drain region is not in contact with the first gate dielectric layer.

20 Claims, 21 Drawing Sheets

Related U.S. Application Data continuation of application No. 15/830,981, filed on Dec. 4, 2017, now Pat. No. 10,431,585.

(51) Int. Cl.
| | |
|---|---|
| *H01L 21/8234* | (2006.01) |
| *H01L 29/41* | (2006.01) |
| *H01L 29/66* | (2006.01) |
| *H01L 21/8238* | (2006.01) |
| *H01L 27/088* | (2006.01) |
| *H01L 29/786* | (2006.01) |
| *H01L 29/775* | (2006.01) |
| *H01L 29/423* | (2006.01) |
| *H01L 29/165* | (2006.01) |
| *H01L 29/20* | (2006.01) |
| *H01L 29/78* | (2006.01) |

(52) U.S. Cl.
CPC ............ *H01L 21/823468* (2013.01); *H01L 21/823864* (2013.01); *H01L 27/088* (2013.01); *H01L 27/092* (2013.01); *H01L 29/0669* (2013.01); *H01L 29/0673* (2013.01); *H01L 29/413* (2013.01); *H01L 29/66439* (2013.01); *H01L 29/66742* (2013.01); *H01L 29/66772* (2013.01); *H01L 29/775* (2013.01); *H01L 29/78696* (2013.01); *H01L 21/823412* (2013.01); *H01L 21/823807* (2013.01); *H01L 29/0646* (2013.01); *H01L 29/0653* (2013.01); *H01L 29/165* (2013.01); *H01L 29/20* (2013.01); *H01L 29/42392* (2013.01); *H01L 29/7853* (2013.01); *H01L 2924/13086* (2013.01)

(58) Field of Classification Search
CPC .......... H01L 21/823864; H01L 27/088; H01L 27/092; H01L 29/0669; H01L 29/0673; H01L 29/413; H01L 29/66439; H01L 29/66742; H01L 29/66772; H01L 29/775; H01L 29/78696; H01L 21/823412; H01L 21/823807; H01L 29/0646; H01L 29/0653; H01L 29/165; H01L 29/20; H01L 29/42392; H01L 29/7853; H01L 2924/13086; H01L 27/02; H01L 29/1033; H01L 29/6656; H01L 29/7831; H01L 29/7846; H01L 29/7848
USPC .......................................................... 257/29
See application file for complete search history.

(56) References Cited

U.S. PATENT DOCUMENTS

| | | |
|---|---|---|
| 9,391,163 B2 | 7/2016 | Chang et al. |
| 9,431,512 B2 | 8/2016 | Koh et al. |
| 9,466,601 B2 | 10/2016 | Yang et al. |
| 2014/0001441 A1 | 1/2014 | Kim et al. |
| 2014/0155639 A1 | 6/2014 | Kawatoko et al. |
| 2015/0084041 A1 | 3/2015 | Hur et al. |
| 2015/0123215 A1 | 5/2015 | Obradovic et al. |
| 2015/0295084 A1 | 10/2015 | Obradovic et al. |
| 2015/0372104 A1 | 12/2015 | Liu et al. |
| 2016/0190339 A1* | 6/2016 | Xie .................. H01L 29/66553 257/347 |
| 2016/0204277 A1 | 7/2016 | Yang et al. |
| 2017/0222006 A1 | 8/2017 | Suh et al. |
| 2017/0222024 A1 | 8/2017 | Bergendahl et al. |
| 2017/0229354 A1 | 8/2017 | Radosavljevic et al. |
| 2017/0250290 A1 | 8/2017 | Chang et al. |
| 2017/0256655 A1 | 9/2017 | Chang et al. |
| 2017/0271510 A1 | 9/2017 | Wang et al. |
| 2017/0288018 A1 | 10/2017 | Tung |
| 2017/0309706 A1 | 10/2017 | Cheng et al. |
| 2017/0317168 A1 | 11/2017 | Cheng et al. |
| 2017/0323949 A1 | 11/2017 | Loubet et al. |
| 2017/0345945 A1 | 11/2017 | Lee et al. |
| 2018/0033797 A1 | 2/2018 | Colinge et al. |
| 2018/0106796 A1 | 4/2018 | Sheu et al. |
| 2018/0108787 A1 | 4/2018 | Cheng et al. |
| 2018/0114727 A1 | 4/2018 | Rodder et al. |
| 2018/0122703 A1 | 5/2018 | Cheng et al. |
| 2018/0122901 A1 | 5/2018 | Kim et al. |
| 2018/0130905 A1 | 5/2018 | Chung et al. |
| 2018/0138268 A1 | 5/2018 | Smith et al. |
| 2018/0145077 A1 | 5/2018 | Dewey et al. |
| 2018/0145184 A1 | 5/2018 | Clifton et al. |
| 2018/0151450 A1 | 5/2018 | Ching et al. |

\* cited by examiner

SEMICONDUCTOR DEVICES AND METHOD OF MANUFACTURING THE SAME

CROSS-REFERENCE TO RELATED APPLICATION

This is a Continuation of U.S. patent application Ser. No. 16/534,070, filed on Aug. 7, 2019, which is a continuation of U.S. patent application Ser. No. 15/830,981, filed on Dec. 4, 2017, which claims priority under 35 U.S.C. § 119 to Korean Patent Application No. 10-2016-0172883, filed on Dec. 16, 2016 in the Korean Intellectual Property Office (KIPO), the disclosures of which are incorporated herein in their entirety by reference.

BACKGROUND

1. Technical Field

The present disclosure relates to a semiconductor device and a method of manufacturing the same. More particularly, the present disclosure relates to a semiconductor device including nanowire transistors and methods of manufacturing the same.

2. Discussion of the Related Art

Electronic devices have become smaller, lighter and thinner. As a result, demand for high integration of semiconductor devices has increased. Due to downscaling of semiconductor devices, a short channel effect is generated in transistors, and thus, a problem has arisen in that semiconductor devices have become less reliable. Thus, a semiconductor device with a multi-gate structure, such as a gate-all-around type nanowire transistor, has been proposed to reduce the short channel effect in transistors.

SUMMARY

The concepts described herein provide a semiconductor device including a nanowire transistor configured to have an optimum performance.

The concepts described herein also provide methods of manufacturing a semiconductor device including a nanowire transistor configured to have an optimum performance.

According to an aspect of the present disclosure, a semiconductor device includes a first transistor in a first region of a substrate and a second transistor in a second region of the substrate. The first transistor includes: a plurality of first semiconductor patterns each having a first channel region; a first gate electrode surrounding the plurality of first semiconductor patterns; a first gate dielectric layer between the plurality of first semiconductor patterns and the first gate electrode; a first source/drain region connected to an edge of the plurality of first semiconductor patterns; and an inner-insulating spacer between the first gate dielectric layer and the first source/drain region. The second transistor includes: a plurality of second semiconductor patterns each having a second channel region; a second gate electrode surrounding the plurality of second semiconductor patterns; a second gate dielectric layer between the plurality of second semiconductor patterns and the second gate electrode; and a second source/drain region connected to an edge of the plurality of second semiconductor patterns. The second gate dielectric layer extends between the second gate electrode and the second source/drain region and is in contact with the second source/drain region. The first source/drain region is not in contact with the first gate dielectric layer.

According to another aspect of the present disclosure, a semiconductor device includes a first transistor and a second transistor. The first transistor is in a first region of a substrate and the second transistor is in a second region of the substrate. The first transistor includes a first nanowire, a first gate electrode, a first gate dielectric layer, a first source/drain region, and an inner-insulating spacer. The first nanowire has a first channel region. The first gate electrode surrounds the first nanowire. The first gate dielectric layer is between the first nanowire and the first gate electrode. The first source/drain region is connected to an edge of the first nanowire. The inner-insulating spacer is between the first gate dielectric layer and the first source/drain region. The second transistor includes a second nanowire, a second gate electrode, a second gate dielectric layer, and a second source/drain region. The second nanowire has a second channel region. The second gate electrode surrounds the second nanowire. The second gate dielectric layer is between the second nanowire and the second gate electrode. The second source/drain region is connected to an edge of the second nanowire.

According to another aspect of the present disclosure, a semiconductor device includes a first transistor and a second transistor. The first transistor is in a first region of a substrate and the second transistor is in a second region of the substrate. The first transistor includes multiple first nanowires, a first gate electrode, a first gate dielectric layer, a first source/drain region, and an inner-insulating spacer. The first nanowires have multiple first channel regions. The first gate electrode surrounds the first nanowires. The first gate dielectric layer is between the first nanowires and the first gate electrode. The first source/drain region is connected to an edge of the first nanowires. An inner-insulating spacer is between the first gate dielectric layer and the first source/drain region. The second transistor includes multiple second nanowires, a second gate electrode, a second gate dielectric layer, and a second source/drain region. The second nanowires have multiple second channel regions. The second gate electrode surrounds the second nanowires. The second gate dielectric layer is between the second nanowires and the second gate electrode. The second source/drain region is connected to an edge of the second nanowires.

According to another aspect of the present disclosure, a semiconductor device includes a substrate with a first region and a second region; a first transistor in the first region of the substrate and comprising a first nanowire, a first gate electrode surrounding the first nanowire, a first gate dielectric layer, a first source region, a first drain region, and an inner-insulating spacer, and a second transistor in the second region of the substrate comprising a second nanowire, a second gate electrode surrounding the second nanowire, a second gate dielectric layer, a second source region and a second drain region. The first gate dielectric layer is provided between the first nanowire and the first gate electrode, and between the inner-insulating spacer and the first gate electrode. The inner-insulating spacer maintains a space between the first gate dielectric layer and the first source region and the first drain region. The second gate dielectric layer is provided between the second nanowire and the second gate electrode, between the second source region and the second gate electrode, and between the second drain region and the second gate electrode.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Hereinafter, example embodiments of the present disclosure will be described in detail with reference to the accompanying drawings.

Figure 1:
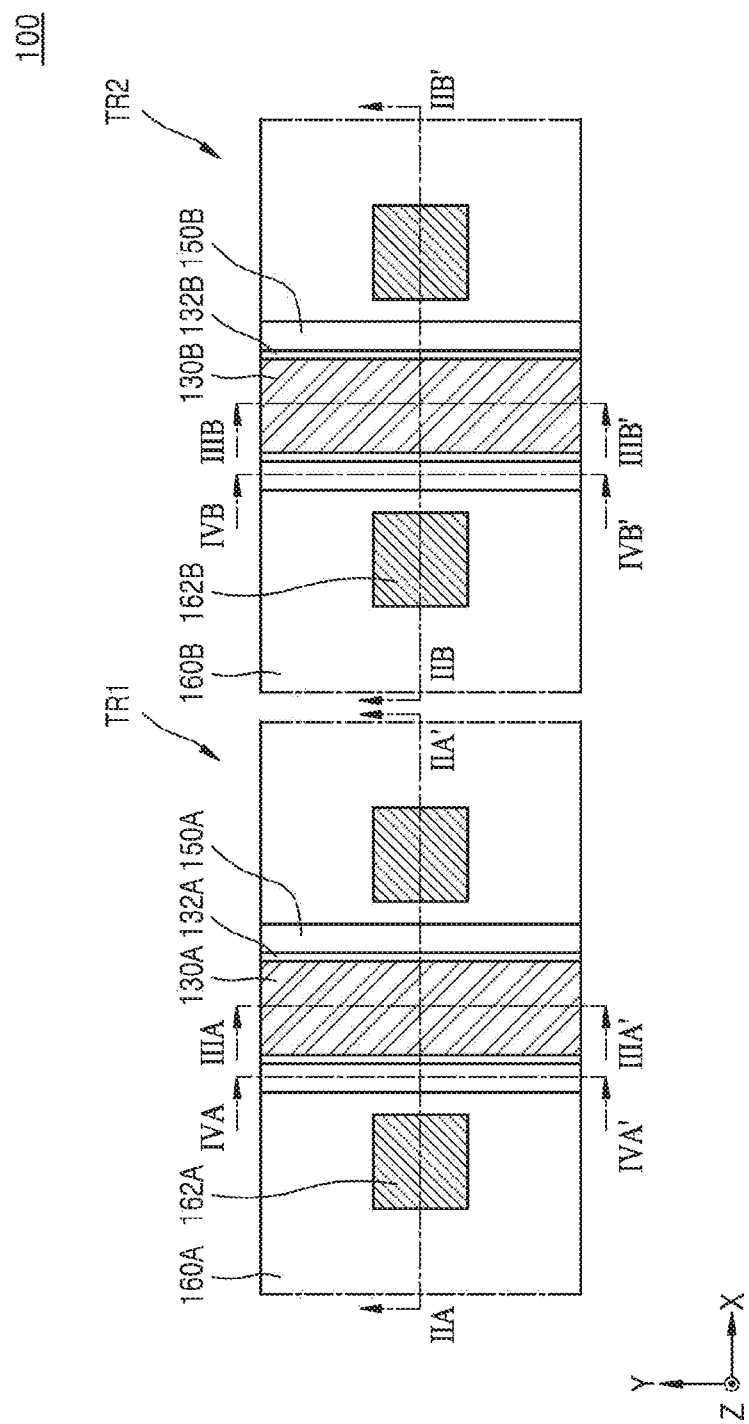
FIG. 1 is a top view of a semiconductor device according to an example embodiment of the present disclosure.
Figure 2:
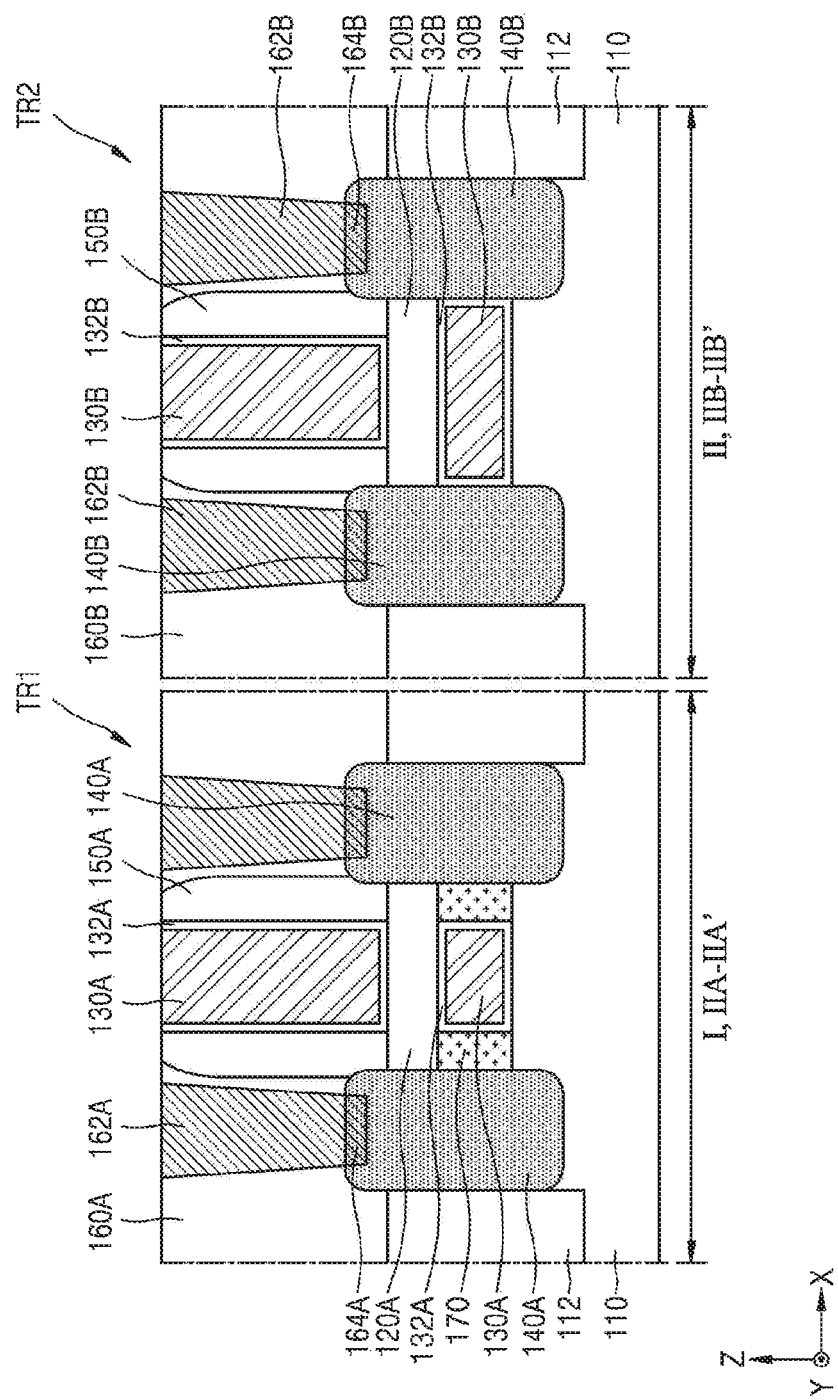
FIG. 2 is a cross-sectional view taken along lines IIA-IIA' and IIB-IIB' of FIG. 1.
Figure 3:
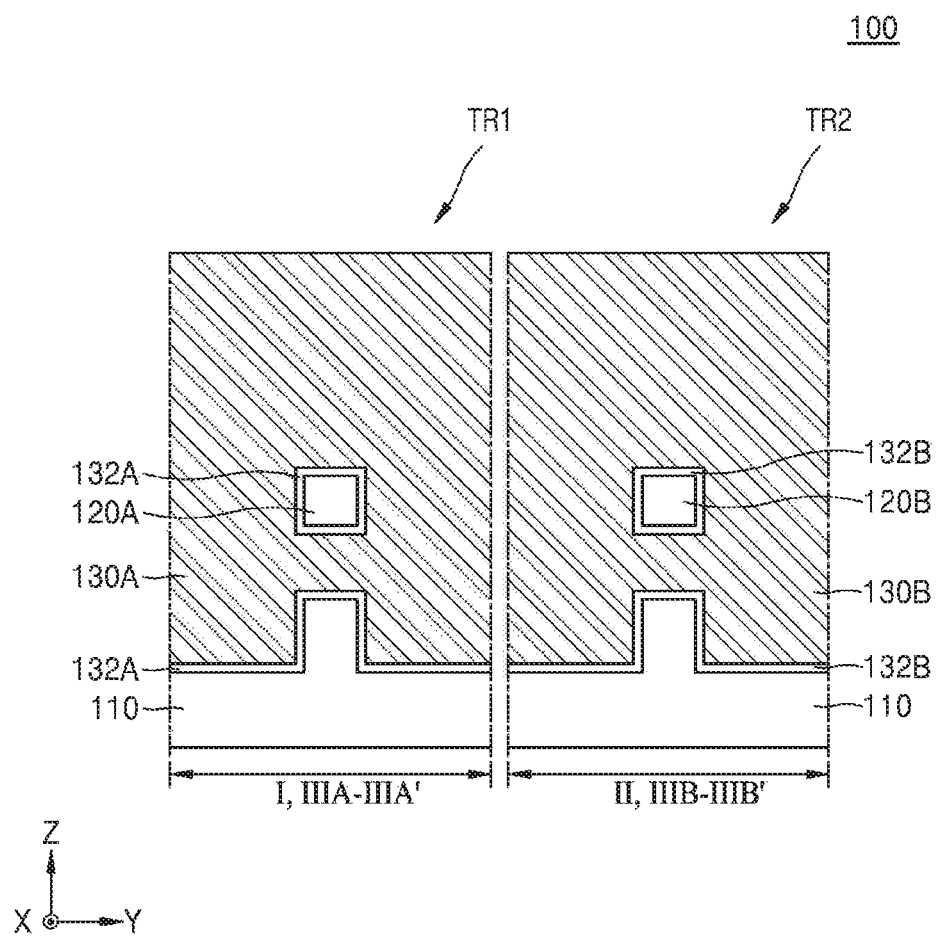
FIG. 3 is a cross-sectional view taken along lines IIIA-IIIA' and IIIB-IIIB' of FIG. 1.
Figure 4:
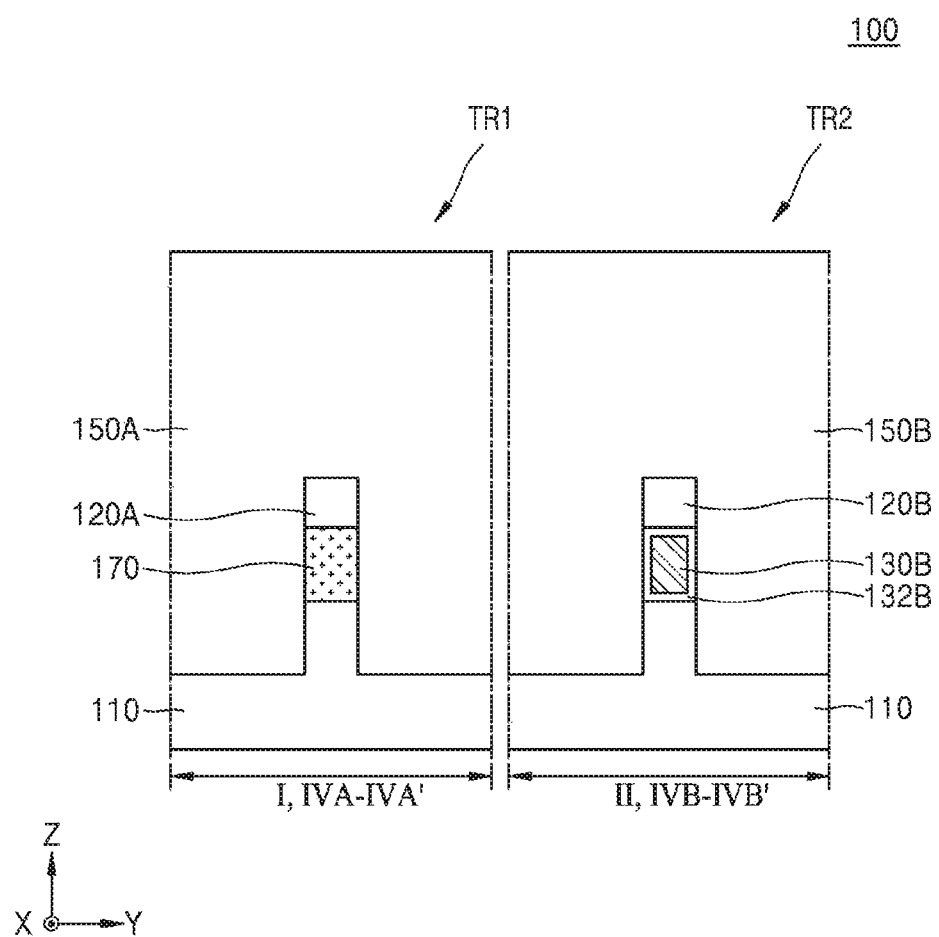
FIG. 4 is a cross-sectional view taken along lines IVA-IVA' and IVB-IVB' of FIG. 1.

FIG. 1 is a top view of a semiconductor device 100 according to an example embodiment of the present disclosure. FIG. 2 is a cross-sectional view taken along lines IIA-IIA' and IIB-IIB' of FIG. 1. FIG. 3 is a cross-sectional view taken along lines IIIA-IIIA' and IIIB-IIIB' of FIG. 1. FIG. 4 is a cross-sectional view taken along lines IVA-IVA' and IVB-IVB' of FIG. 1.

Referring to FIGS. 1 through 4, a substrate 110 of the semiconductor device 100 includes a first region I and a second region II. An active region (not shown) may be defined by an isolation layer 112 in each of the first region I and the second region II. A first transistor TR1 may be formed in the active region of the first region I and a second transistor TR2 may be formed in the active region of the second region II. In an example embodiment, the first transistor TR1 may be an n-type metal-oxide-semiconductor (NMOS) transistor, and the second transistor TR2 may be a p-type metal-oxide-semiconductor (PMOS) transistor.

In an example embodiment, the substrate 110 may be a silicon substrate. In an example embodiment, the substrate 110 may constitute at least one device selected from a large scale integration (LSI), a logic circuit, an image sensor such as a CMOS imaging sensor (CIS), a memory device such as a flash memory, a dynamic random access memory (DRAM), a static random access memory (SRAM), an electrically erasable programmable read-only memory (EEPROM), a phase change RAM (PRAM), a magnetic RAM (MRAM), or a resistive RAM (RRAM), or a micro-electro-mechanical system (MEMS).

The first transistor TR1 may include a first nanowire 120A, a first gate electrode 130A, a first gate dielectric layer 132A, a pair of first source/drain regions 140A, and an inner-insulating spacer 170. In FIG. 2, the first gate electrode 130A is shown above and below the first nanowire 120A. Similarly, the first gate dielectric layer 132A is shown above and below the first nanowire 120A and around all four sides of the first gate electrode 130A below the first nanowire 120A and around three of the four sides of the first gate electrode 130A above the first nanowire 120A. Accordingly, as shown in FIG. 2, the first gate electrode 130A and the first gate dielectric layer 132A surround the first nanowire 120A in parallel planes in the YZ directions.

The first nanowire 120A may include a first channel region (not shown) of the first transistor TR1. In an example embodiment, the first nanowire 120A may include a Group IV semiconductor, a Group II-IV compound semiconductor, or a Group III-V compound semiconductor. For example, the first nanowire 120A may include Si, Ge, SiGe, InGaAs, InAs, GaSb, InSb, or a combination of these materials. Channel regions are not detailed relative to the first nanowire 120A in FIGS. 1-12 (or other nanowires), but correspond to channel layers 120P described with respect to FIGS. 13-18 and generally provide for channeling energy (electrons) between the first source/drain regions 140A. The first nanowire 120A generally has a dimension (size) much greater in the X direction than in the YZ plan, even in a ratio of 1000 or greater.

The first gate electrode 130A may include a doped polysilicon, a metal, or a combination of these materials. For example, the first gate electrode 130A may include Al, Cu, Ti, Ta, W, Mo, TaN, NiSi, CoSi, TiN, WN, TiAl, TiAlN, TaCN, TaC, TaSiN, or a combination of these materials, but the first gate electrode 130A is not limited thereto.

The first gate dielectric layer 132A may include a silicon oxide film, a silicon oxynitride film, a high-k film having a dielectric constant greater than that of silicon oxide film, or a combination of these materials. For example, the high-k film that may be used as the first gate dielectric layer 132A may include HfO$_2$, HfSiO, HfSiON, HfTaO, HfTiO, HfZrO, zirconium oxide, aluminum oxide, an HfO$_2$—Al$_2$O$_3$ alloy, or a combination of these materials, but the first gate dielectric layer 132a and the high-k film are not limited thereto.

The pair of the first source/drain regions 140A may be formed on the substrate 110. The pair of the first source/drain regions 140A may extend to both edges of the first nanowire 120A along a direction (a Z direction) perpendicular to a main surface of the substrate 110. In an example embodiment, the pair of the first source/drain regions 140A may include a doped SiGe film, a doped Ge film, a doped SiC film or a doped InGaAs film, but the pair of the first source/drain regions 140a are not limited thereto. The pair of the first source/drain regions 140A may be a semiconductor layer re-grown using an epitaxy process from the substrate 110 and the first nanowire 120A, and the pair of the first source/drain regions 140A may include a different material from the substrate 110 and the first nanowire 120A.

The pair of the first source/drain regions 140A may have an upper level higher than that of the first nanowire 120A. In an example embodiment, a portion of the pair of the first source/drain regions 140A may be a doped region functioning as a source/drain region for the first transistor TR1. For example, when a portion of the pair of the first source/drain regions 140A, from a bottom surface to a certain height of the pair of the first source/drain regions 140A, is highly doped with dopant ions, the portion may be a dopant region functioning as a source/drain region for the first transistor TR1. Unlike this, when a portion of the pair of the first source/drain regions 140A, from a central region to a certain height is highly doped with a dopant, the portion may be a dopant region functioning as a source/drain region for the first transistor TR1. In another example embodiment, whole of the pair of the first source/drain region 140A may be a dopant region functioning as source/drain region for the first transistor TR1.

A first external insulating spacer 150A may cover a sidewall or sidewalls of the first gate electrode 130A on the opposite side of the first gate dielectric layer 132A from the first gate electrode 130A. That is, the first external insulating spacer 150A may surround a side or sides of the first gate electrode 130A in parallel planes in the XY direction above the first nanowire 120A. The same is true for the second external insulating spacer 150B described herein. Additionally, both edges of the first nanowire 120A adjacent to the pair of the first source/drain regions 140A may also be covered by the first external insulating spacer 150A.

The pair of the first source/drain regions 140A and a part of the first external insulating spacer 150A may be covered by a first insulating layer 160A. A first contact 162A may be connected to the pair of the first source/drain regions 140A through the first insulating layer 160A. A first metal silicide layer 164A may be formed between the first contact 162A and the pair of the first source/drain regions 140A.

An inner-insulating spacer 170 may be formed between the substrate 110 and the first nanowire 120A. The inner-insulating spacer 170 may be arranged between the first gate electrode 130A and the pair of the first source/drain regions 140A. The first gate dielectric layer 132A may be arranged between the inner-insulating spacer 170 and the first gate electrode 130A. In FIG. 2, the inner-insulating spacer 170 is shown on one side (i.e., below) but not the other (i.e., above) of the first nanowire 120A. Accordingly, while the first gate electrode 130A and first gate dielectric layer 132A are shown on both sides (i.e., below and above) of the first nanowire 120A in FIG. 2, the inner-insulating spacer 170 is shown only below. That is, the first gate dielectric layer 132A may extend from a surface of the first nanowire 120A to a surface of a sidewall of the inner-insulating spacer 170 so that, between an upper surface of the substrate 110 and the (lower surface in FIG. 2 of the) first nanowire 120A, the first gate dielectric layer 132A is interposed between the first gate electrode 130A and the inner-insulating spacer 170. Accordingly, the pair of the first source/drain regions 140A may contact the inner-insulating spacer 170, and may not contact the first gate dielectric layer 132A.

The inner-insulating spacer 170 may include a different material from the first gate dielectric layer 132A. In an example embodiment, the inner-insulating spacer 170 may include a material having a dielectric constant less than a material that constitutes the first gate dielectric layer 132A. In another example embodiment, the inner-insulating spacer 170 may include a Group IV semiconductor oxide, a Group II-IV compound semiconductor oxide, or a Group III-V compound semiconductor oxide, an oxide such as a silicon oxide, or a silicon oxynitride, a silicon nitride, or a combination of these materials.

The first external insulating spacer 150A and the inner-insulating spacer 170 may be respectively arranged at locations perpendicularly overlapping each other and at different levels from each other along a direction (a Z direction) perpendicular to the main surface of the substrate 110. In an example embodiment, the inner-insulating spacer 170 may include a material different from a material that constitutes the first external insulating spacer 150A. In an example embodiment, the inner-insulating spacer 170 may include a material having a dielectric constant less than that of a material that constitutes the first external insulating spacer 150A.

The second transistor TR2 may include a second nanowire 120B, a second gate electrode 130B, a second gate dielectric layer 132B, and a pair of second source/drain regions 140B. In FIG. 2, the second gate electrode 130B is shown above and below the second nanowire 120B. Similarly, the second gate dielectric layer 132B is shown above and below the second nanowire 120B and around all four sides of the second gate electrode 130B below the second nanowire 120B and around three of the four sides of the second gate electrode 130B above the second nanowire 120B. Accordingly, as shown in FIG. 2, the second gate electrode 130B and the second gate dielectric layer 132B surround the second nanowire 120B in parallel planes in the YZ directions.

The second nanowire 120B may include a second channel region (not shown) of the second transistor TR2. Channel regions are not detailed relative to the second nanowire 120B in FIGS. 1-12 (or other nanowires), but correspond to channel layers 120P described with respect to FIGS. 13-18 and generally provide for channeling energy (holes) between the second source/drain regions 140B. The second nanowire 120B generally has a dimension (size) much greater in the X direction than in the YZ plan, even in a ratio of 1000 or greater.

The second gate electrode 130B and the second gate dielectric layer 132B may have similar characteristics described with respect to the first gate electrode 130A and the first gate dielectric layer 132A. For example, the second gate electrode 130B may include a doped polysilicon, a metal, or a combination of these materials, and the second gate dielectric layer 132B mat include a silicon oxide film, a silicon oxynitride film, a high-k film having a dielectric constant greater than that of silicon oxide film, or a combination of these materials.

In an example embodiment, the second gate electrode 130B and the first gate electrode 130A may include same material, and the second gate dielectric layer 132B and the first gate dielectric layer 132A may include same material. Unlike this, the second gate electrode 130B and the first gate electrode 130A may include different materials from each other, and the second gate dielectric layer 132B and the first gate dielectric layer 132A may include different materials from each other.

The pair of the second source/drain regions 140B may be formed on the substrate 110. The pair of the second source/drain regions 140B may extend to both edges of the second nanowire 120B along a direction (a Z direction) perpendicular to a main surface of the substrate 110. The pair of the second source/drain regions 140B may be a semiconductor layer re-grown using an epitaxy process from the substrate 110 and the second nanowire 120B, and the pair of the second source/drain regions 140B may include a different material from the substrate 110 and the second nanowire 120B. In an example embodiment, the pair of the second source/drain regions 140B may include a doped SiGe film, a doped Ge film, a doped SiC film, or a doped InGaAs film, but the pair of the second source/drain regions 140B are not limited thereto.

In an example embodiment, the pair of the second source/drain regions 140B may include different material from the pair of the first source/drain regions 140A. For example, the pair of the first source/drain regions 140A may include SiC and the pair of the second source/drain regions 140B may include SiGe or Ge.

A second external insulating spacer 150B, a second insulating layer 160B, a second contact 162B, and a second metal silicide layer 164B respectively may have similar characteristics to the first external insulating spacer 150A, the first insulating layer 160A, the first contact 162A, and the first metal silicide layer 164A. In an example embodiment, the second external insulating spacer 150B, the second insulating layer 160B, the second contact 162B, and the second metal silicide layer 164B respectively may be formed in the same processes for forming the first external insulating spacer 150A, the first insulating layer 160A, the first contact 162A, and the first metal silicide layer 164A. In another example embodiment, the second external insulating spacer 150B may be formed in a process different from a process for forming the first external insulating spacer 150A. Also, the second insulating layer 160B may be formed in a process different from a process for forming the first insulating layer 160A.

Unlike the first transistor TR1, the second transistor TR2 may not include the inner-insulating spacer 170, and the inner-insulating spacer 170 may not be arranged between the substrate 110 and the second nanowire 120B. As depicted in FIG. 2, the second gate dielectric layer 132B may be arranged between the second gate electrode 130B and the pair of the second source/drain regions 140B. That is, the second gate dielectric layer 132B may extend from between the substrate 110 and the second nanowire 120B to between the second gate electrode 130B and the pair of the second source/drain regions 140B. The pair of the second source/drain regions 140B may contact the second gate dielectric layer 132B.

The second external insulating spacer 150B and a part of the second gate electrode 130B may be respectively arranged at locations perpendicularly overlapping each other and at different levels from each other along a direction (a Z direction) perpendicular to the main surface of substrate 110.

As depicted in FIG. 2, the inner-insulating spacer 170 may be formed between the first gate electrode 130A and the pair of the first source/drain regions 140A, whereas the inner-insulating spacer 170 may not be formed between the second gate electrode 130B and the pair of the second source/drain regions 140B. Accordingly, the first transistor TR1 and second transistor TR2 are constructed differently, and whereas the second gate dielectric layer 132B contacts the second source/drain region 140B on either side of the second gate electrode 130B, the first gate dielectric layer 132A is spaced apart by the inner-insulating spacer 170 from the first source/drain region 140A on either side of the first gate electrode 130A.

Since the inner-insulating spacer 170 is formed between the first gate electrode 130A and the pair of the first source/drain regions 140A, a separation distance between the first gate electrode 130A and the pair of the first source/drain regions 140A may be increased. Accordingly, in the first transistor TR1, the generation of a parasitic capacitance between the first gate electrode 130A and the pair of the first source/drain regions 140A may be reduced, and the first transistor TR1 may shows a rapid operation speed. In particular, when the first transistor TR1 is an NMOS transistor, the performance of the NMOS transistor may be increased due to the reduction of the parasitic capacitance.

Since the inner-insulating spacer 170 is not formed between the second gate electrode 130B and the pair of the second source/drain regions 140B, the pair of the second source/drain regions 140B may have a high crystal quality. If the inner-insulating spacer 170 is arranged on exposed surfaces of a pair of the second source/drain recess regions 140RB (refer to FIG. 15) in a process for growing the pair of the second source/drain regions 140B, multiple stacking faults or dislocations may generate in the pair of the second source/drain regions 140B. The crystal quality of the pair of the second source/drain regions 140B may not be high due to the stacking faults or dislocations, and the pair of the second source/drain regions 140B may be difficult to function as a stressor that applies a compressive strain to the second nanowire 120B.

However, since inner-insulating spacer 170 is not formed between the second gate electrode 130B and the pair of the second source/drain regions 140B, the generation of the stacking faults or dislocations in the pair of the second source/drain regions 140B may be suppressed, and thus, the pair of the second source/drain regions 140B may have a high crystal quality. Accordingly, the pair of the second source/drain regions 140B may function as a stressor that applies a compressive strain to the second nanowire 120B, and thus, the second transistor TR2 may show a rapid operation speed. In particular, if the second transistor TR2 is a PMOS transistor, the performance of the PMOS transistor may be increased by the high crystal quality of the pair of the second source/drain regions 140B.

In the semiconductor device 100 according to an example embodiment described above, the first transistor TR1, for example, an NMOS transistor may provide a high performance due to the reduction of a parasitic capacitance generated by the inner-insulating spacer 170, and the second transistor TR2, for example, a PMOS transistor may provide a high performance due to the high crystal quality of the pair of the second source/drain regions 140B. Accordingly, the semiconductor device 100 may have an optimum performance.

Figure 5:
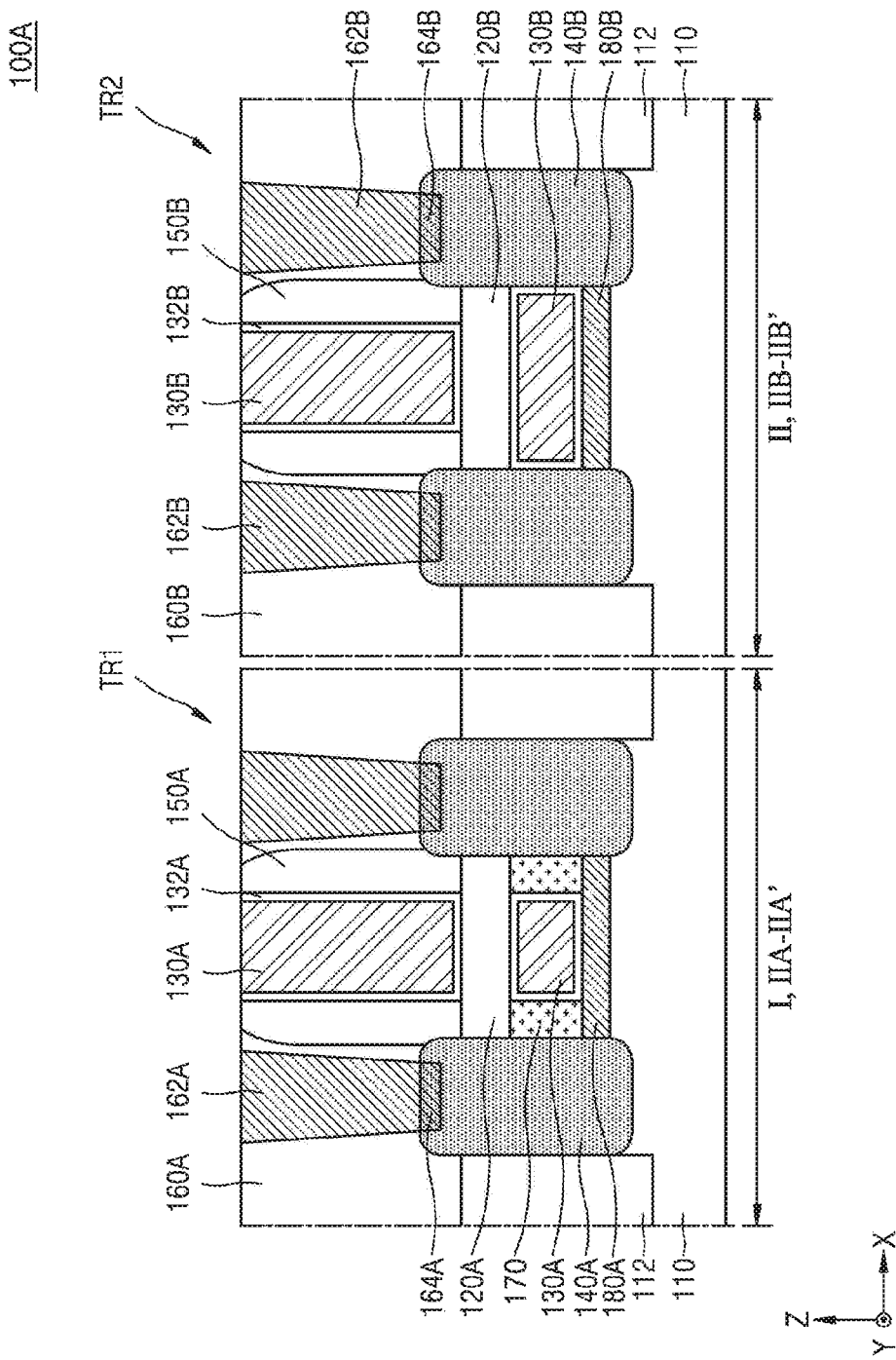
FIG. 5 is a cross-sectional view of a semiconductor device according to an example embodiment of the present disclosure.

FIG. 5 is a cross-sectional view of a semiconductor device 100B according to an example embodiment of the present disclosure. FIG. 5 shows cross-sections corresponding to the cross-sections taken along the line IIA-IIA' and the line IIB-IIB' of FIG. 1. In FIG. 5, like reference numerals are used to indicate elements that are identical to the elements of FIGS. 1 through 4.

Referring to FIG. 5, the semiconductor device 100A may further include a first channel separation region 180A between the substrate 110 and the first gate electrode 130A and a second channel separation region 180B between the substrate 110 and the second gate electrode 130B. The first channel separation region 180A may include conductive type dopant ions opposite to the conductive type dopant included in the pair of the first source/drain regions 140A, and the second channel separation region 180B may include a conductive type dopant opposite to the conductive type dopant included in the pair of the second source/drain regions 140B. The first channel separation region 180A and second channel separation region 180B may prevent the formation of channels on an upper surface of the substrate 110 facing bottom surfaces of the first gate electrode 130A and second gate electrode 130B. For example, a channel path may be formed from a lower portion of one of the pair of the first source/drain regions 140A to a lower portion of the other one of the pair of the first source/drain regions 140A through the first nanowire 120A, and accordingly, a short channel effect may be prevented.

Figure 6:
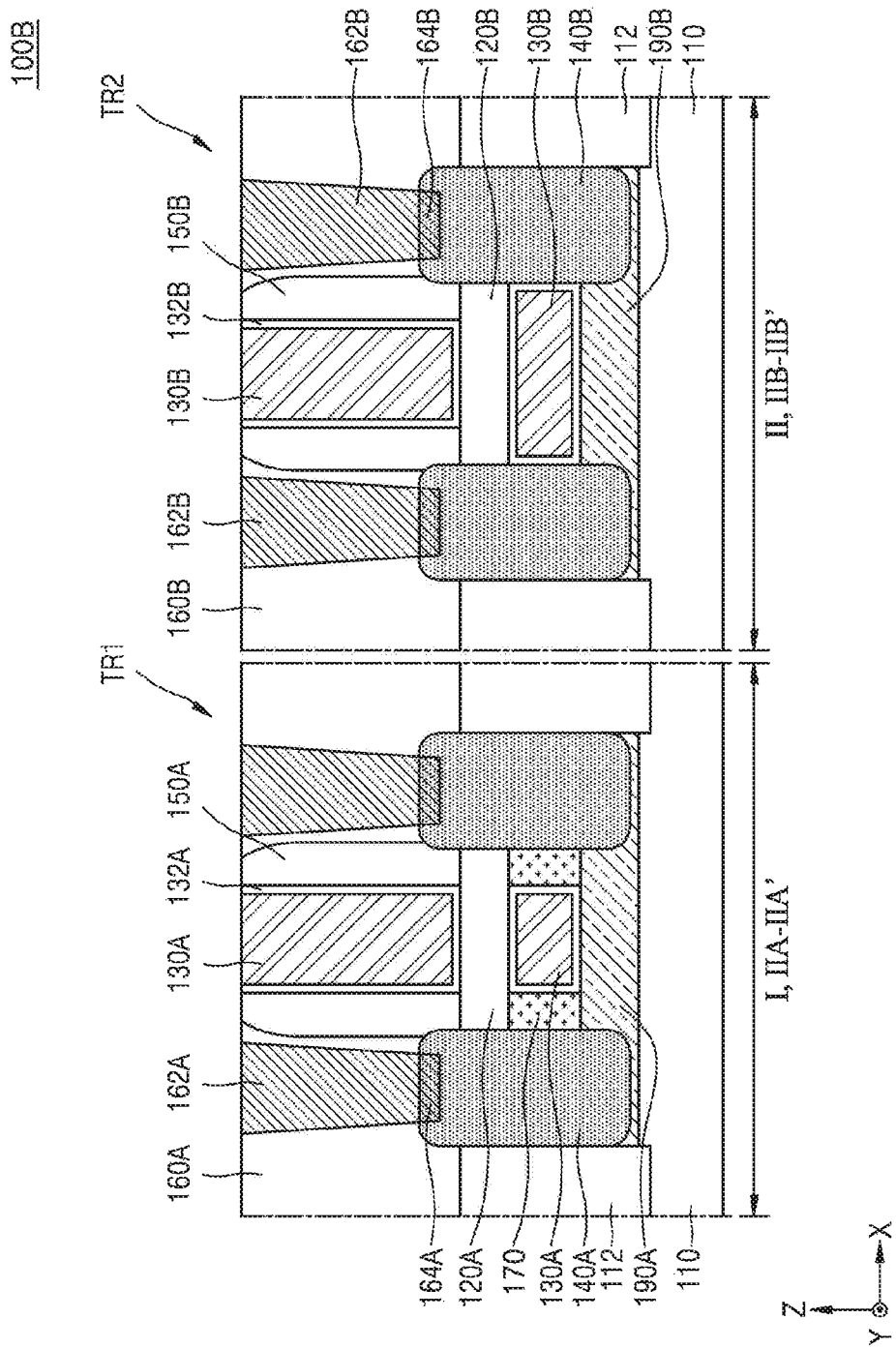
FIG. 6 is a cross-sectional view of a semiconductor device according to an example embodiment of the present disclosure.

FIG. 6 is a cross-sectional view of a semiconductor device 100B according to an example embodiment of the present disclosure. FIG. 6 shows cross-sections corresponding to the cross-sections taken along the line IIA-IIA' and the line IIB-IIB' of FIG. 1. In FIG. 6, like reference numerals are used to indicate elements that are identical to the elements of FIGS. 1 through 5.

Referring to FIG. 6, the semiconductor device 100B may include may further include a first buffer layer 190A between the substrate 110 and the first gate electrode 130A and a second buffer layer 190B between the substrate 110 and the second gate electrode 130B.

The first buffer layer 190A and second buffer layer 190B may include a material having a lattice constant greater than that of a material used to form the substrate 110. In an example embodiment, the substrate 110 may include Si and the first buffer layer 190A and second buffer layer 190B may include GaAs, InP, InAlAs, or a combination of these materials. In an example embodiment, the first buffer layer 190A and second buffer layer 190B may be a single layer or a multilayer. For example, the first buffer layer 190A and second buffer layer 190B may have a multi-layered structure in which a first layer including GaAs and a second layer including InP or InAlAs are sequentially stacked on the substrate 110.

In an example embodiment, the pair of the first source/drain regions 140A may include a material different from the first nanowire 120A, and the pair of the second source/drain regions 140B may include a material different from the second nanowire 120B. Accordingly, the first nanowire 120A and second nanowire 120B may include a strained channel. As a result, carrier mobility of the first transistor TR1 and second transistor TR2 that include the first nanowire 120A and second nanowire 120B may be increased.

For example, in the second transistor TR2, the second nanowire 120B may include Ge, and the pair of the second source/drain regions 140B may include doped SiGe. In the first transistor TR1, the first nanowire 120A may include InGaAs, and the pair of the first source/drain regions 140A may include doped InGaAs. A composition ratio of In and Ga of InGaAs included in the first nanowire 120A may be different from the composition ratio of In and Ga of InGaAs included in the pair of the first source/drain regions 140A. However, the materials and the composition ratios of first nanowire 120A and second nanowire 120B and the pair of the first source/drain region 140A and second source/drain region 140B are not limited thereto.

Figure 7:
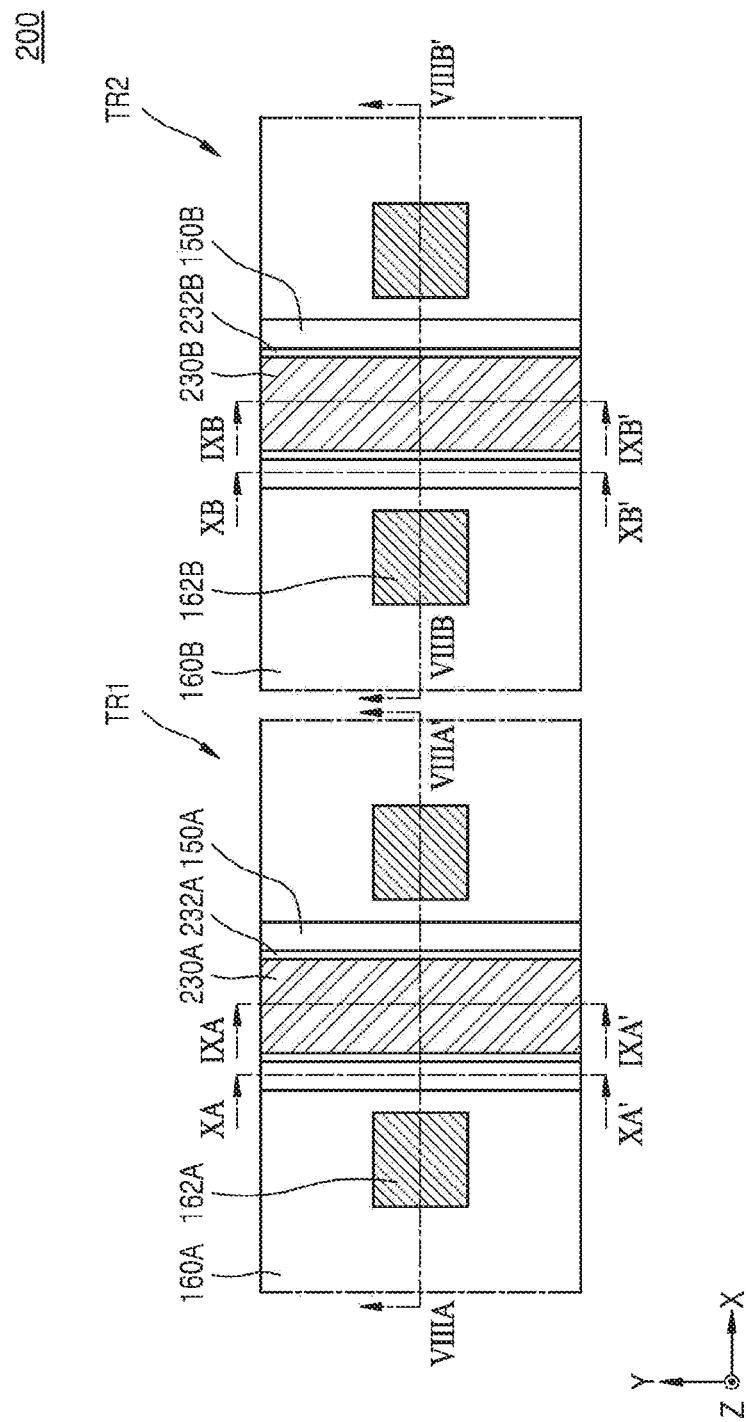
FIG. 7 is a top view of a semiconductor device according to an example embodiment of the present disclosure.
Figure 8:
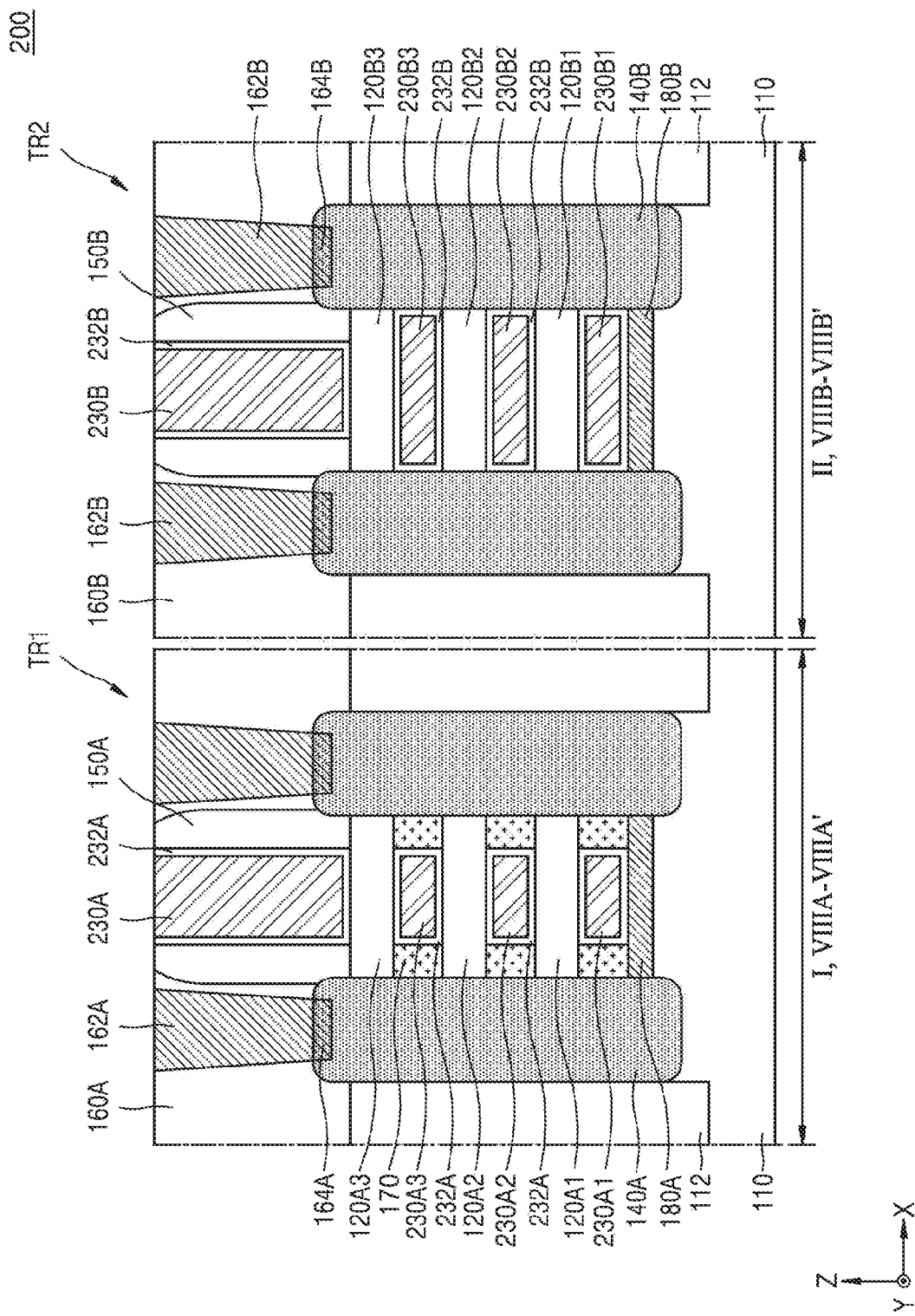
FIG. 8 is a cross-sectional view taken along lines VIIIA-VIIIA' and VIIIB-VIIIB' of FIG. 7.
Figure 9:
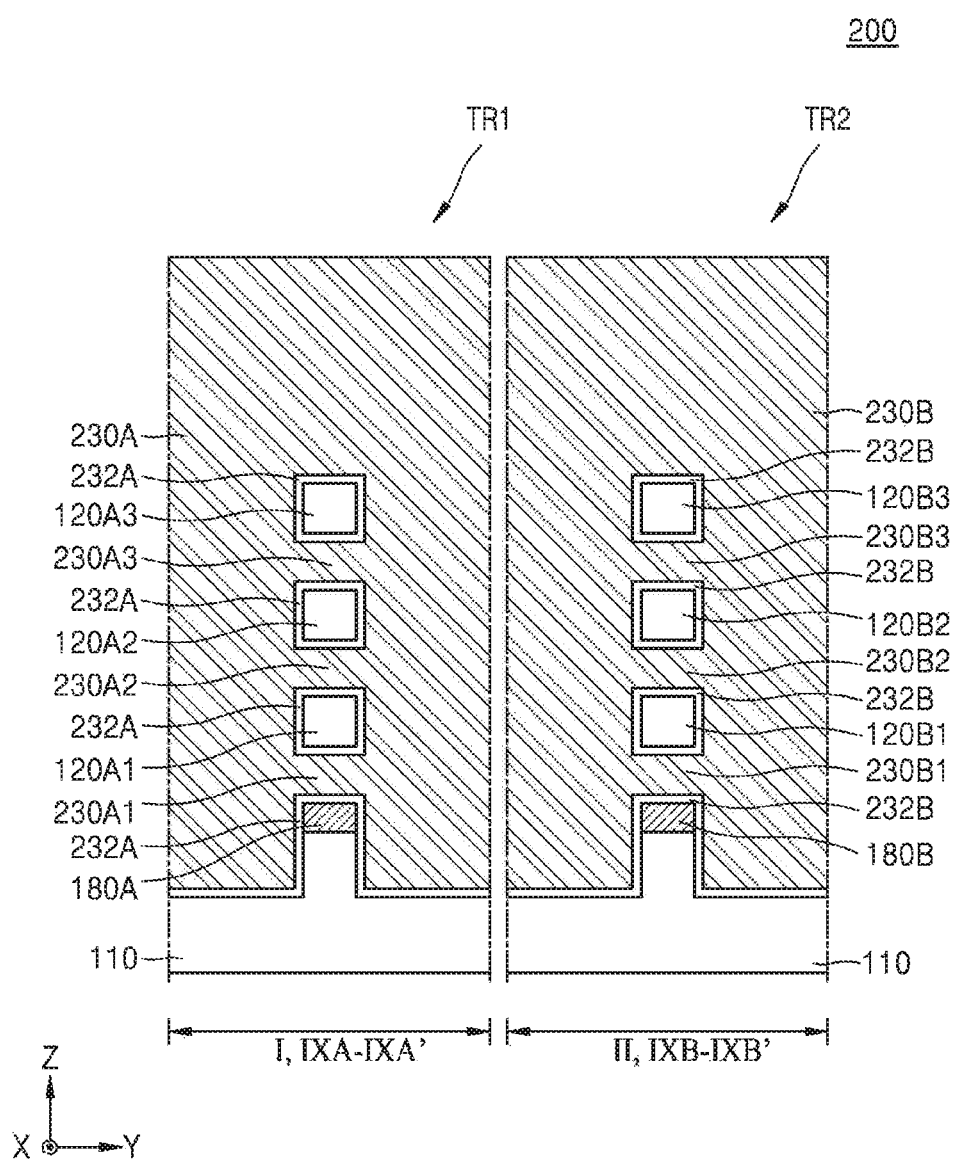
FIG. 9 is a cross-sectional view taken along lines IXA-IXA' and IXB-IXB' of FIG. 7.
Figure 10:
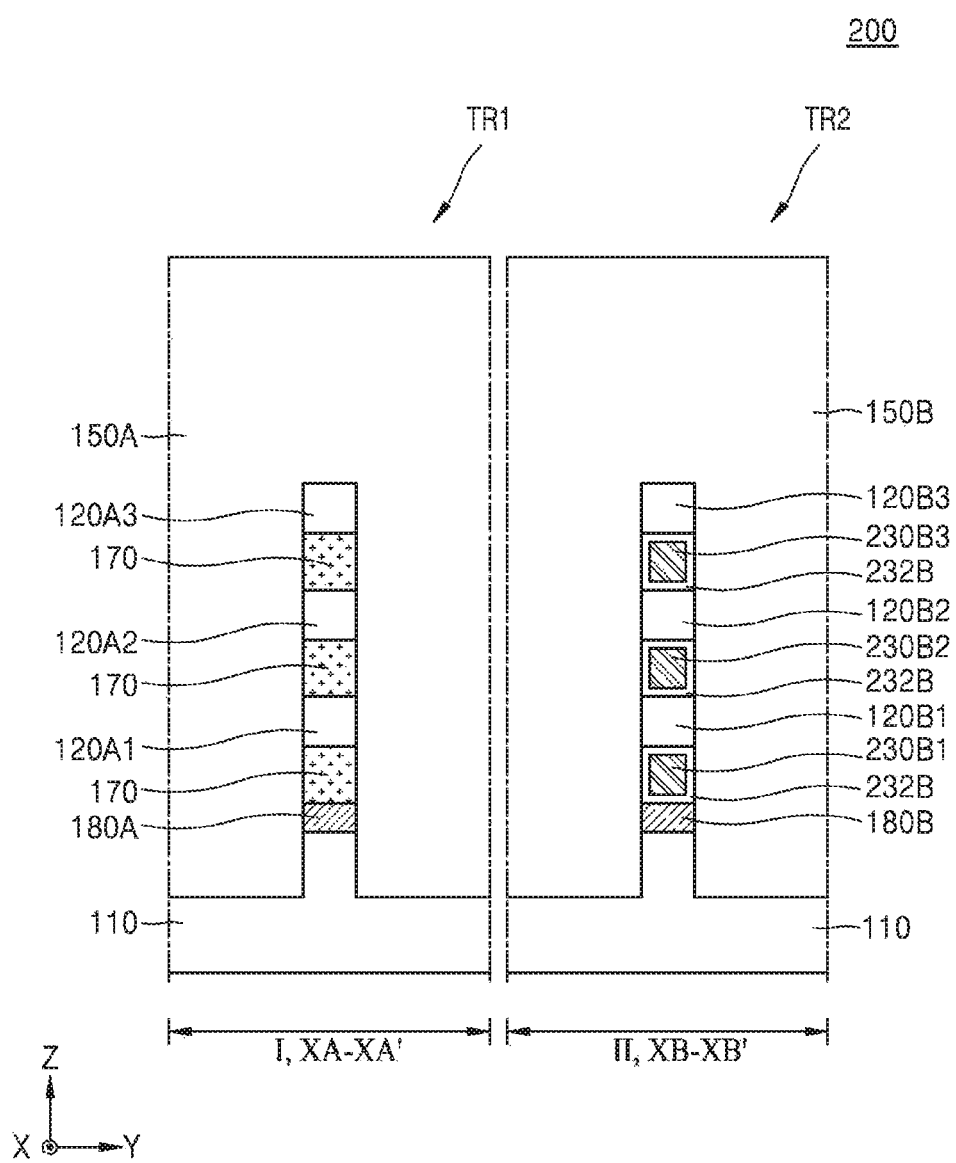
FIG. 10 is a cross-sectional view taken along lines XA-XA' and IIB-IIB' of FIG. 7.

FIG. 7 is a top view of a semiconductor device 200 according to an example embodiment of the present disclosure. FIG. 8 is a cross-sectional view taken along lines VIIIA-VIIIA' and VIIIB-VIIIB' of FIG. 7. FIG. 9 is a cross-sectional view taken along lines IXA-IXA' and IXB-IXB' of FIG. 7. FIG. 10 is a cross-sectional view taken along lines XA-XA' and IIB-IIB' of FIG. 7. In FIGS. 7 through 10, like reference numerals are used to indicate elements that are identical to the elements of FIGS. 1 through 6.

Referring to FIGS. 7 through 10, the semiconductor device 200 may include a first transistor TR1 formed in a first region I of a substrate 110 and a second transistor TR2 formed in a second region II of the substrate 110.

The first transistor TR1 may include multiple first nanowires 120A1, 120A2 and 120A3, a first gate electrode 230A, a first gate dielectric layer 232A, a pair of first source/drain regions 140A, and inner-insulating spacers 170. The first gate electrode 230A surrounds the first nanowires 120A1, 120A2 and 120A3 in parallel planes in the YZ directions. The first gate dielectric layer 232A is arranged between the first gate electrode 230A and the first nanowires 120A1, 120A2 and 120A3. The inner-insulating spacers 170 are arranged between the pair of the first source/drain regions 140A and the first gate electrode 230A.

The second transistor TR2 may include multiple second nanowires 120B1, 120B2 and 120B3, a second gate electrode 230B, a second gate dielectric layer 232B, and a pair of second source/drain regions 140B. The second gate electrode 230B surrounds the second nanowires 120B1, 120B2 and 120B3 in parallel planes in the YZ directions. The second gate dielectric layer 232B is arranged between the second gate electrode 230B and the second nanowires 120B1, 120B2 and 120B3.

In the first transistor TR1, the first nanowires 120A1, 120A2 and 120A3 respectively locate on different levels from each other from an upper surface of the substrate 110, and distances to each of the first nanowires 120A1, 120A2 and 120A3 from the upper surface of the substrate 110 are different from each other. The first nanowires 120A1, 120A2 and 120A3 respectively may include multiple first channel regions (not shown). The first gate electrode 230A may be formed to surround at least a part of each of the first nanowires 120A1, 120A2 and 120A3 in parallel planes in the YZ directions. The first gate electrode 230A may include first sub-gate electrodes 230A1, 230A2, and 230A3 respectively formed in a space between the substrate 110 and the first nanowires 120A1, 120A2 and 120A3. The first gate dielectric layer 232A may be arranged between the first gate electrode 230A and the first nanowires 120A1, 120A2 and 120A3.

The inner-insulating spacers 170 respectively may be formed between the first sub-gate electrodes 230A1, 230A2, and 230A3 and the pair of the first source/drain regions 140A between the substrate 110 and the first nanowires 120A1, 120A2 and 120A3. The pair of the first source/drain regions 140A may not contact the first gate dielectric layer 232A, and the inner-insulating spacers 170 may include a different material from the first gate dielectric layer 232A.

In the second transistor TR2, the second nanowires 120B1, 120B2 and 120B3 respectively locate on different levels from each other from an upper surface of the substrate 110, and distances to each of the second nanowires 120B1, 120B2 and 120B3 from the upper surface of the substrate 110 are different from each other. The second nanowires 120B1, 120B2 and 120B3 respectively may include multiple second channel regions (not shown). The second gate electrode 230B may be formed to surround at least a part of each of the second nanowires 120B1, 120B2 and 120B3 in parallel planes in the YZ directions. The second gate electrode 230B may include second sub-gate electrodes 230B1, 230B2, and 230B3 respectively formed in a space between the substrate 110 and the second nanowires 120B1, 120B2 and 120B3. The second gate dielectric layer 232B may be arranged between the second gate electrode 230B and the second nanowires 120B1, 120B2 and 120B3. The second gate dielectric layer 132B may extend to a space between pair of the second source/drain regions 140B and the second sub-gate electrodes 230B1, 230B2, and 230B3.

As depicted in FIG. 8, the inner-insulating spacers 170 are formed only between the first sub-gate electrodes 230A1, 230A2, and 230A3 and the pair of the first source/drain regions 140A, and may not be formed between the second sub-gate electrodes 230B1, 230B2, and 230B3 and the pair of the second source/drain regions 140B. Accordingly, a separation distance between the pair of the first source/drain regions 140A and the first sub-gate electrodes 230A1, 230A2, and 230A3 may be greater than a separation distance between the pair of the second source/drain regions 140B and the second sub-gate electrodes 230B1, 230B2, and 230B3. In an example embodiment, when the first transistor TR1 is an NMOS transistor, since the separation distance between the pair of the first source/drain regions 140A and the first sub-gate electrodes 230A1, 230A2, and 230A3 is relatively large, the generation of parasitic capacitance between the pair of the first source/drain regions 140A and the first sub-gate electrodes 230A1, 230A2, and 230A3 may be reduced. Accordingly, the NMOS transistor may have a rapid operation speed.

However, the inner-insulating spacers 170 are not formed between the second sub-gate electrodes 230B1, 230B2, and 230B3 and the pair of the second source/drain regions 140B. Thus, the pair of the second source/drain regions 140B may have a high crystal quality. If multiple inner-insulating spacers 170 are arranged on exposed surfaces of pair of the second source/drain recess regions 140RB (refer to FIG. 15) in a process for growing the pair of the second source/drain regions 140B, multiple stacking faults or dislocations may be generated in the pair of the second source/drain regions 140B due to the inner-insulating spacers 170 including an insulating material. The crystal quality of the pair of the second source/drain regions 140B may not be high due to the stacking faults or dislocations, and it may be difficult for the pair of the second source/drain regions 140B to function as a stressor that applies stress to the second nanowire 120B.

However, the inner-insulating spacer 170 is not formed between the second gate electrode 130B and the pair of the second source/drain regions 140B. The pair of the second source/drain regions 140B may be formed using first through third sacrifice layers 240P1, 240P2, 240P3 (refer to FIG. 16) and the second nanowires 120B1, 120B2 and 120B3 as seed layers. The generation of stacking faults or dislocations in the pair of the second source/drain regions 140B is suppressed, and thus, the pair of the second source/drain regions 140B may have high crystal quality. Accordingly, the pair of the second source/drain regions 140B may function as a stressor that applies stress to the second nanowires 120B1, 120B2 and 120B3, and thus, the second transistor TR2 may have a high operation speed. In particular, when the second transistor TR2 is a PMOS transistor, the performance of the PMOS transistor may be increased by the high crystal quality of the pair of the second source/drain regions 140B.

In the semiconductor device 200 according to an example embodiment, the first transistor TR1, that is, an NMOS transistor may provide a high performance due to the reduction of a parasitic capacitance by the inner-insulating spacer 170, and the second transistor TR2, that is, a PMOS transistor may provide a high performance by a high crystal quality of the pair of the second source/drain regions 140B. Accordingly, the semiconductor device 200 may provide a high performance.

Figure 11:
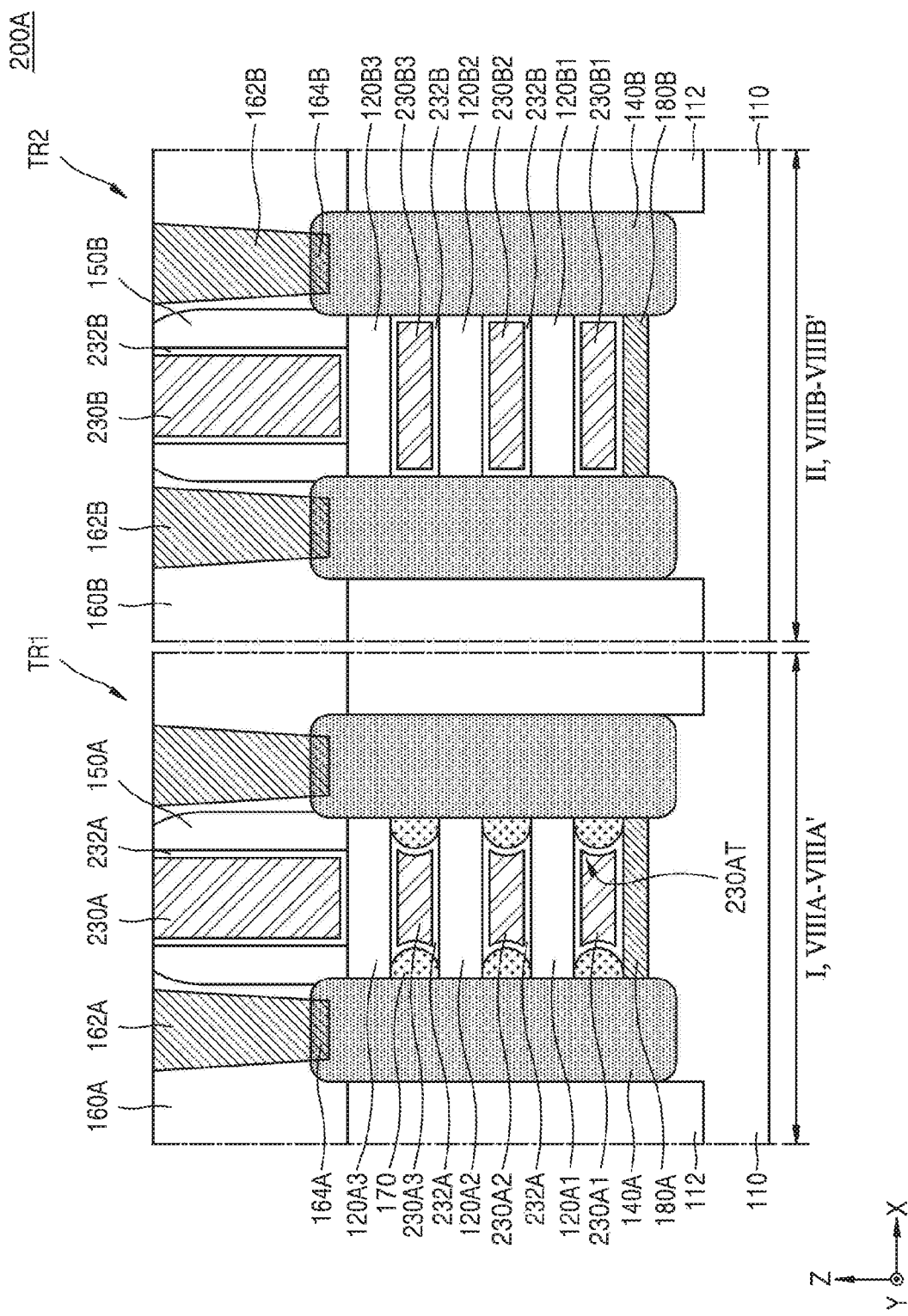
FIG. 11 is a cross-sectional view of a semiconductor device according to an example embodiment of the present disclosure.

FIG. 11 is a cross-sectional view of a semiconductor device 200A according to an example embodiment of the present disclosure. FIG. 11 shows cross-sections corresponding to the cross-sections taken along the line VIIIA-VIIIA' and the line VIIIB-VIIIB' of FIG. 7. In FIG. 11, like reference numerals are used to indicate elements that are identical to the elements of FIGS. 1 through 10.

Referring to FIG. 11, each of the inner-insulating spacers 170 may have a sidewall protruding in a direction towards the first sub-gate electrodes 230A1, 230A2, and 230A3. The first gate dielectric layer 232A may be formed to have a conformal thickness on the sidewall of each of the inner-insulating spacers 170. The first sub-gate electrodes 230A1, 230A2, and 230A3, which are arranged on the sidewalls of the inner-insulating spacers 170 with the first gate dielectric layer 232A interposed therebetween, may have sidewalls concaved towards an inner side thereof. As depicted in FIG. 11, the first sub-gate electrodes 230A1, 230A2, and 230A3 respectively may include tail portions 230AT on an upper edge and a lower edge thereof conforming a shape of the sidewall of the inner-insulating spacers 170.

The profile of the sidewalls of the inner-insulating spacers 170 is reduced or exaggerated for convenience of explanation, and thus, a slope of the sidewalls of the inner-insulating spacers 170 may vary as necessary.

In an example process for forming the inner-insulating spacers 170, after alternately and sequentially forming a sacrifice layer 240P (refer to FIG. 13) and a channel layer 120P (refer to FIG. 13), first source/drain recess regions 140RA (refer to FIG. 17) are formed by etching portions of the sacrifice layer 240P and the channel layer 120P. As a result, a sidewall of the sacrifice layer 240P may be exposed on sidewalls of the first source/drain recess regions 140RA. At this point, parts of the exposed sidewall of the sacrifice layer 240P may be selectively removed using an etch condition in which the sacrifice layer 240P has an etch selectivity with respect to the channel layer 120P (for example, an etching rate of the sacrifice layer 240P is relatively higher than that of the channel layer 120P). Parts of the sacrifice layer 240P removed according to the etch condition may be larger in a central region than an upper edge or a lower edge. Thus, as depicted in FIG. 11, the inner-insulating spacers 170 each having protruded sidewall may be formed by performing an etch-back process after forming an insulating layer (not shown) on locations where the sacrifice layer 240P is removed. However, the inner-insulating spacers 170 and other features described above are not limited to the above descriptions. The inner-insulating spacers 170 may be formed by performing a thermal oxidation process on the exposed sidewall of the sacrifice layer 240P.

Figure 12:
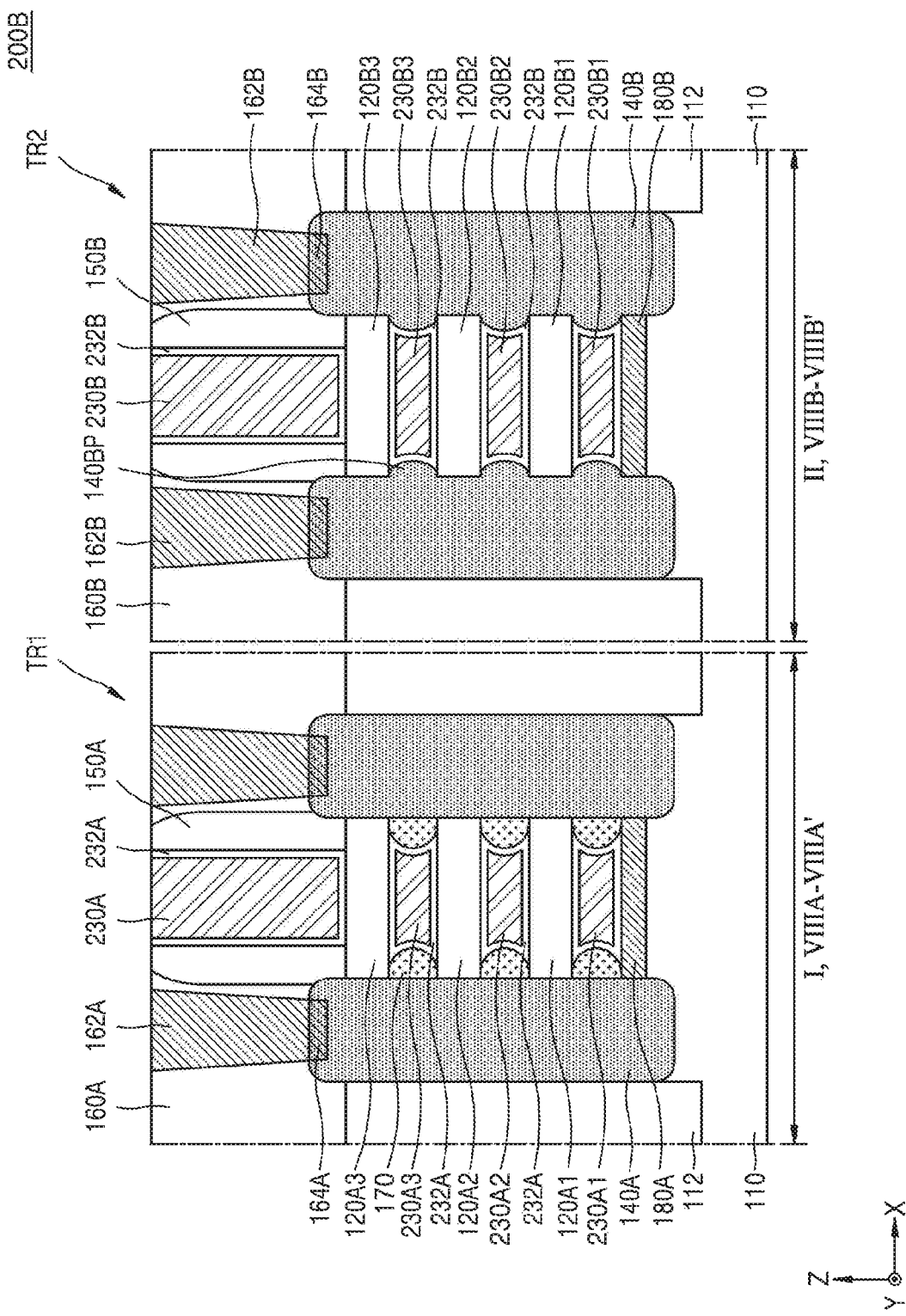
FIG. 12 is a cross-sectional view of a semiconductor device according to an example embodiment of the present disclosure.

FIG. 12 is a cross-sectional view of a semiconductor device 200B according to an example embodiment of the present disclosure. FIG. 12 shows cross-sections corresponding to the cross-sections taken along the line VIIIA-VIIIA' and the line VIIIB-VIIIB' of FIG. 7. In FIG. 12, like reference numerals are used to indicate elements that are identical to the elements of FIGS. 1 through 11.

Referring to FIG. 12, the pair of the second source/drain regions 140B may include multiple protrusion portions 140BP facing the second sub-gate electrodes 230B1, 230B2, and 230B3, and a second gate dielectric layer 232B may be arranged between the protrusion portions 140BP and the second sub-gate electrodes 230B1, 230B2, and 230B3.

In an example process for forming the pair of the second source/drain regions 140B, after alternately and sequentially forming the sacrifice layer 240P (refer to FIG. 13) and the channel layer 120P (refer to FIG. 13), pair of second source/drain recess regions 140RB (refer to FIG. 15) are formed by etching portions of the sacrifice layer 240P and the channel layer 120P. As a result, a sidewall of the sacrifice layer 240P may be exposed on sidewalls of the pair of the second source/drain recess regions 140RB. At this point, parts of the exposed sidewall of the sacrifice layer 240P may be selectively removed using an etch condition in which the sacrifice layer 240P has an etch selectivity with respect to the channel layer 120P (for example, an etching rate of the sacrifice layer 240P is relatively higher than that of the channel layer 120P). Parts of the sacrifice layer 240P removed according to the etch condition may be larger in a central region than an upper edge or a lower edge. Afterwards, the pair of the second source/drain regions 140B that fill inner sides of the pair of the second source/drain recess regions 140RB may be formed using an epitaxy process.

In example embodiments, damage to the sidewall of the sacrifice layer 240P may occur or a crystal quality of the sacrifice layer 240P may be partly degraded in the etching process for forming the pair of the second source/drain recess regions 140RB. However, the part of the sidewall of the sacrifice layer 240P where the crystal quality is degraded may be removed by a selective removal process. Afterwards, the pair of the second source/drain regions 140B having a high crystal quality may be formed using the sacrifice layer 240P and the channel layer 120P exposed on the sidewalls of the pair of the second source/drain recess regions 140RB as seed layers.

In another example embodiment, a sidewall area of the pair of the second source/drain recess regions 140RB may be increased by the selective removal process, and accordingly, relatively large areas of the sacrifice layer 240P and the channel layer 120P may be exposed on the inner sidewalls of the pair of the second source/drain recess regions 140RB. Thus, the pair of the second source/drain regions 140B having a high crystal quality may be formed using the exposed areas of the sacrifice layer 240P and the channel layer 120P as seed layers. However, the pair of the second source/drain regions 140B are not limited thereto.

It should be understood that the sidewall profiles of the pair of the second source/drain regions 140B and the protrusion portion 140BP depicted in FIG. 12 are simplified or exaggerated for convenience of explanation.

In the semiconductor device 200 according to the example embodiments described above, the first transistor TR1, for example, an NMOS transistor may provide a high performance due to a parasitic capacitance in the inner-insulating spacers 170, and the second transistor TR2, for example, a PMOS transistor may provide a high performance by a high crystal quality of the pair of the second source/drain regions 140B. Accordingly, the semiconductor device 200 may provide a high performance.

FIGS. 13 through 21 are cross-sectional views illustrating a method of manufacturing a semiconductor device 200 according to an example embodiment of the present disclosure. In FIGS. 13 through 21, cross-sections corresponding to the cross-sections taken along line VIII-VIII' of FIG. 7 are depicted according to a sequence of manufacturing processes.

Figure 13:
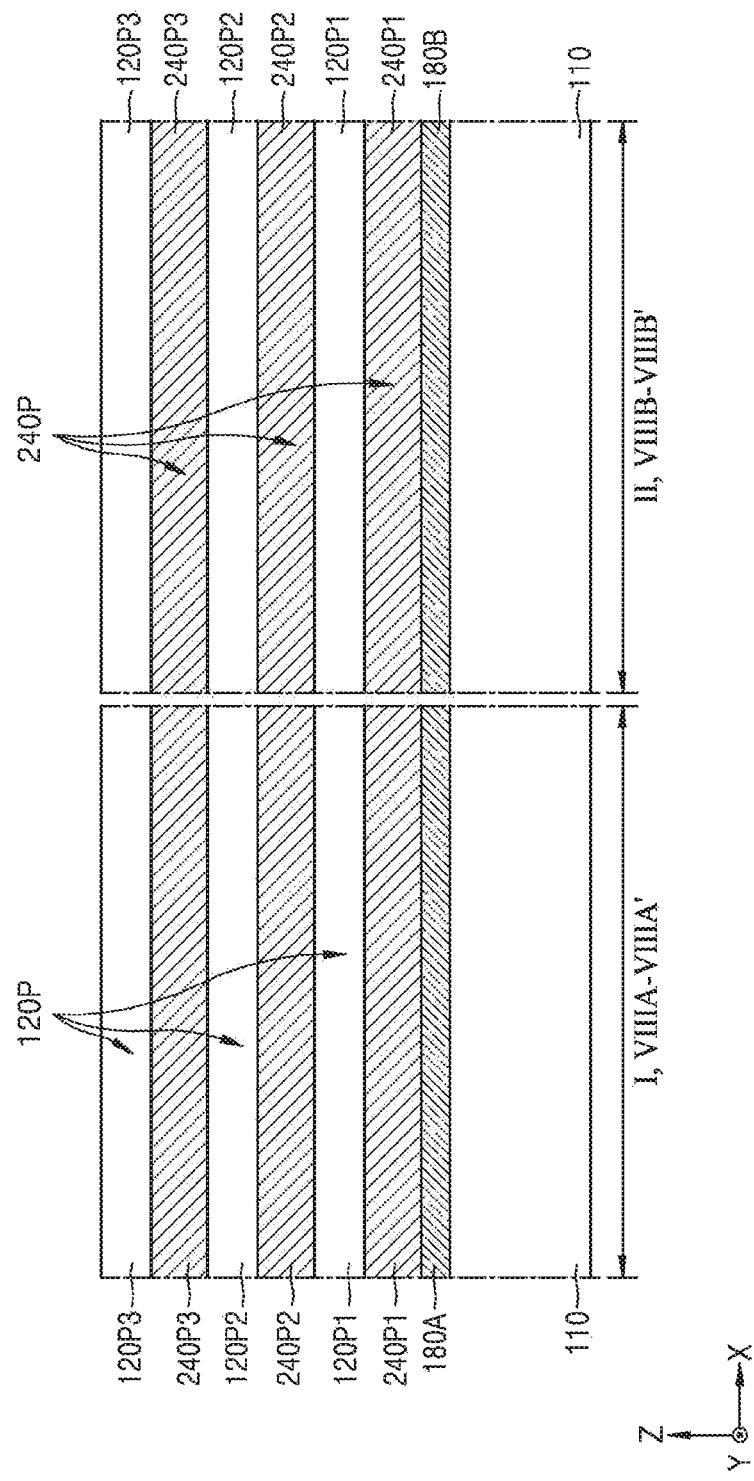
FIG. 13 is a cross-sectional view illustrating a method of manufacturing a semiconductor device according to an example embodiment of the present disclosure.

Referring to FIG. 13, the first channel separation region 180A and second channel separation region 180B may be formed by implanting dopant ions at a high concentration into the substrate 110 from the main surface of the substrate 110. The substrate 110 may include a first region I and a second region II. The first region I may be an NMOS transistor region, and the second region II may be a PMOS transistor region.

Afterwards, the sacrifice layer 240P and the channel layer 120P are alternately and sequentially formed on the substrate 110. The sacrifice layer 240P and the channel layer 120P may be formed using an epitaxy process. The sacrifice layer 240P may include first through third sacrifice layers 240P1, 240P2, and 240P3, and the channel layer 120P may include first through third channel layers 120P1, 120P2, and 120P3.

In example embodiments, the sacrifice layer 240P and the channel layer 120P may include materials having an etch selectivity with respect to each other. For example, the sacrifice layer 240P and the channel layer 120P respectively may include a monolayer of a Group IV semiconductor, a Group II-IV compound semiconductor, or a Group III-V compound semiconductor, and the sacrifice layer 240P and the channel layer 120P may include different materials from each other. In an example embodiment, the sacrifice layer 240P may include SiGe, and the channel layer 120P may include single-crystal silicon.

In example embodiments, the epitaxy process may be vapor-phase epitaxy (VPE) process, a chemical vapor deposition (CVD) process such as an ultra-high vacuum chemical vapor deposition (UHV-CVD) process, a molecular beam epitaxy process, or a combination of these processes. In the epitaxy process, a liquid or vapor precursor may be used as a precursor required for forming the sacrifice layer 240P and the channel layer 120P.

Figure 14:
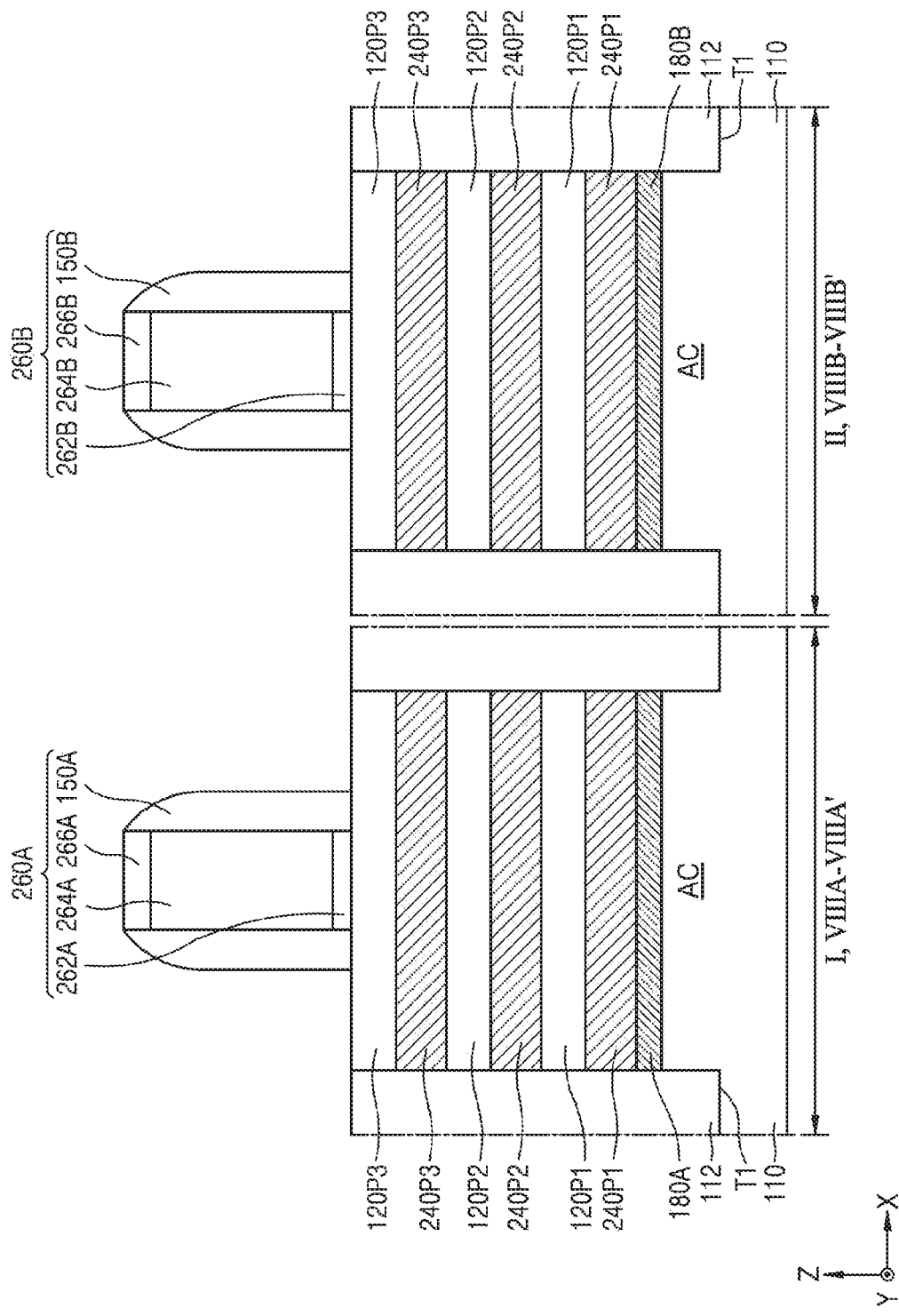
FIG. 14 is a cross-sectional view illustrating a method of manufacturing a semiconductor device according to an example embodiment of the present disclosure.

Referring to FIG. 14, after forming a mask pattern (not shown) extending with a predetermined length in a first direction (an X direction) on the channel layer 120P, a first trench T1 may be formed by etching the first through third channel layers 120P1, 120P2, and 120P3, the first through third sacrifice layers 240P1, 240P2, and 240P3, the first channel separation region 180A and second channel separation region 180B, and the substrate 110 using the mask pattern as an etch mask.

Afterwards, an inner side of the trench T1 is filled with an insulating material, an isolation layer 112 may be formed by planarizing an upper surface of the insulating material. An active region AC may be defined on the substrate 110 by the isolation layer 112, and the active region AC may include a well into which predetermined type dopant ions are implanted.

Afterwards, in the first region I and second region II, first dummy gate structure 260A and second dummy gate structure 260B may be formed on a stack structure of the first through third sacrifice layers 240P1, 240P2, and 240P3 and the first through third channel layers 120P1, 120P2, and 120P3 and first dummy gate structure 260A and second dummy gate structure 260B and on the isolation layer 112. The first dummy gate structure 260A and second dummy gate structure 260B respectively may include first etch-stop layer 262A and second etch-stop layer 262B, first dummy gate electrode 264A and second dummy gate electrode 264B, first capping layer 266A and second capping layer 266B, and first external insulating spacer 150A and second external insulating spacer 150B.

For example, the first dummy gate structure 260A and second dummy gate structure 260B may include polysilicon, the first capping layer 266A and second capping layer 266B may include a silicon nitride film. The first etch-stop layer 262A and second etch-stop layer 262B may include a material having an etch selectivity with respect to the first dummy gate structure 269A and second dummy gate structure 260B. For example, the first etch-stop layer 262A and second etch-stop layer 262B may include at least one film selected from a thermal oxide film, a silicon oxide film, and a silicon nitride film. The first external insulating spacer 150A and second external insulating spacer 150B may include silicon oxide, silicon oxynitride, or silicon nitride, but are not limited thereto.

Figure 15:
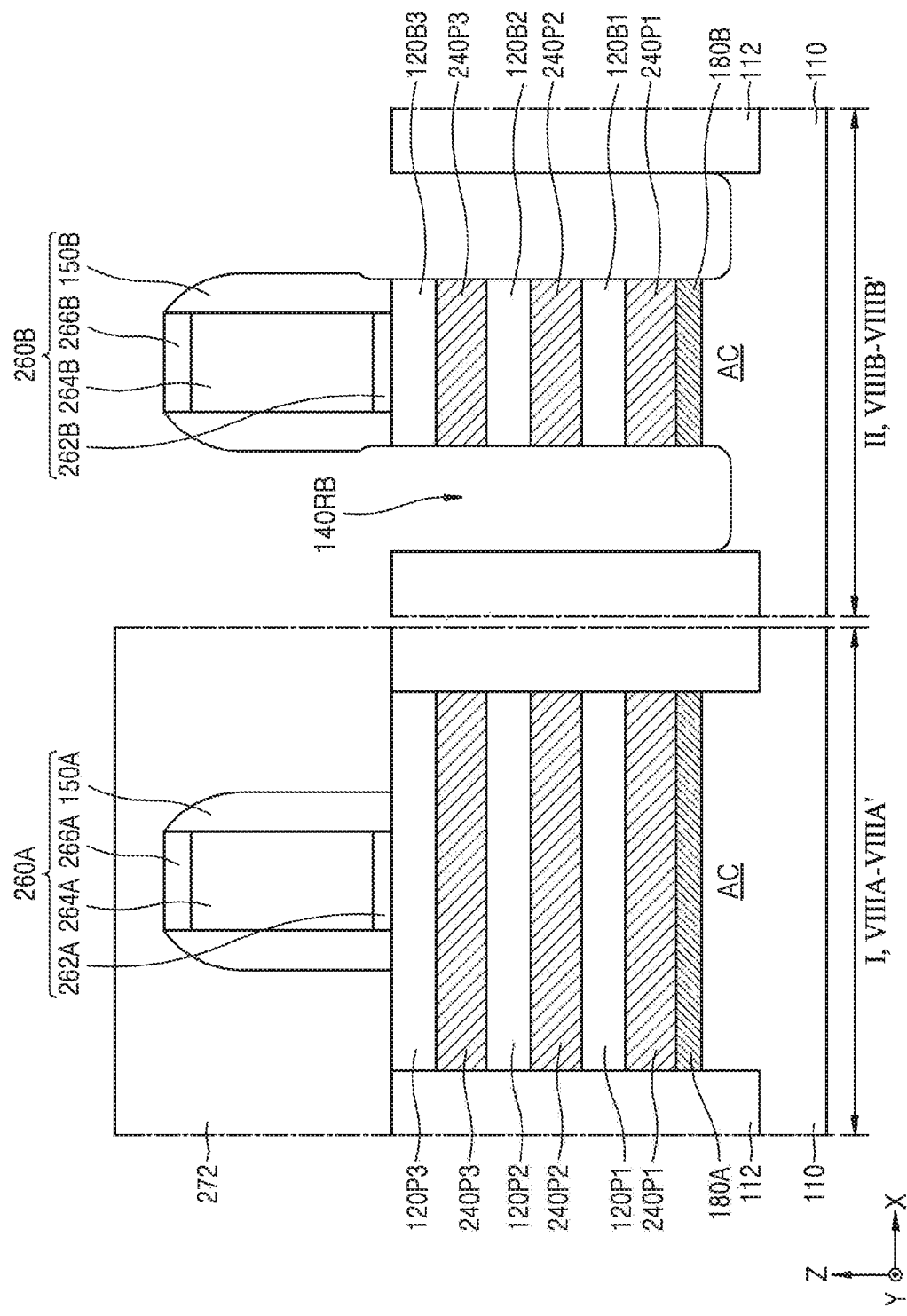
FIG. 15 is a cross-sectional view illustrating a method of manufacturing a semiconductor device according to an example embodiment of the present disclosure.

Referring to FIG. 15, a first protection layer 272 covering the first dummy gate structure 260A and the first through third channel layers 120P1, 120P2, and 120P3 may be formed in the first region I. In the second region II, the pair of the second source/drain recess regions 140RB may be formed by etching parts of the first through third channel layers 120P1, 120P2, and 120P3, the first through third sacrifice layers 240P1, 240P2, and 240P3, the second channel separation region 180B, and the substrate 110 using the second dummy gate structure 260B as an etch mask.

The pair of the second source/drain recess regions 140RB may have a depth larger than that of the second channel separation region 180B in the substrate 110. Since the pair of the second source/drain recess regions 140RB are formed, parts of the first through third channel layers 120P1, 120P2, and 120P3 are removed, and the second nanowires 120B1, 120B2 and 120B3 may be formed from the remaining parts of the first through third channel layers 120P1, 120P2, and 120P3.

Figure 16:
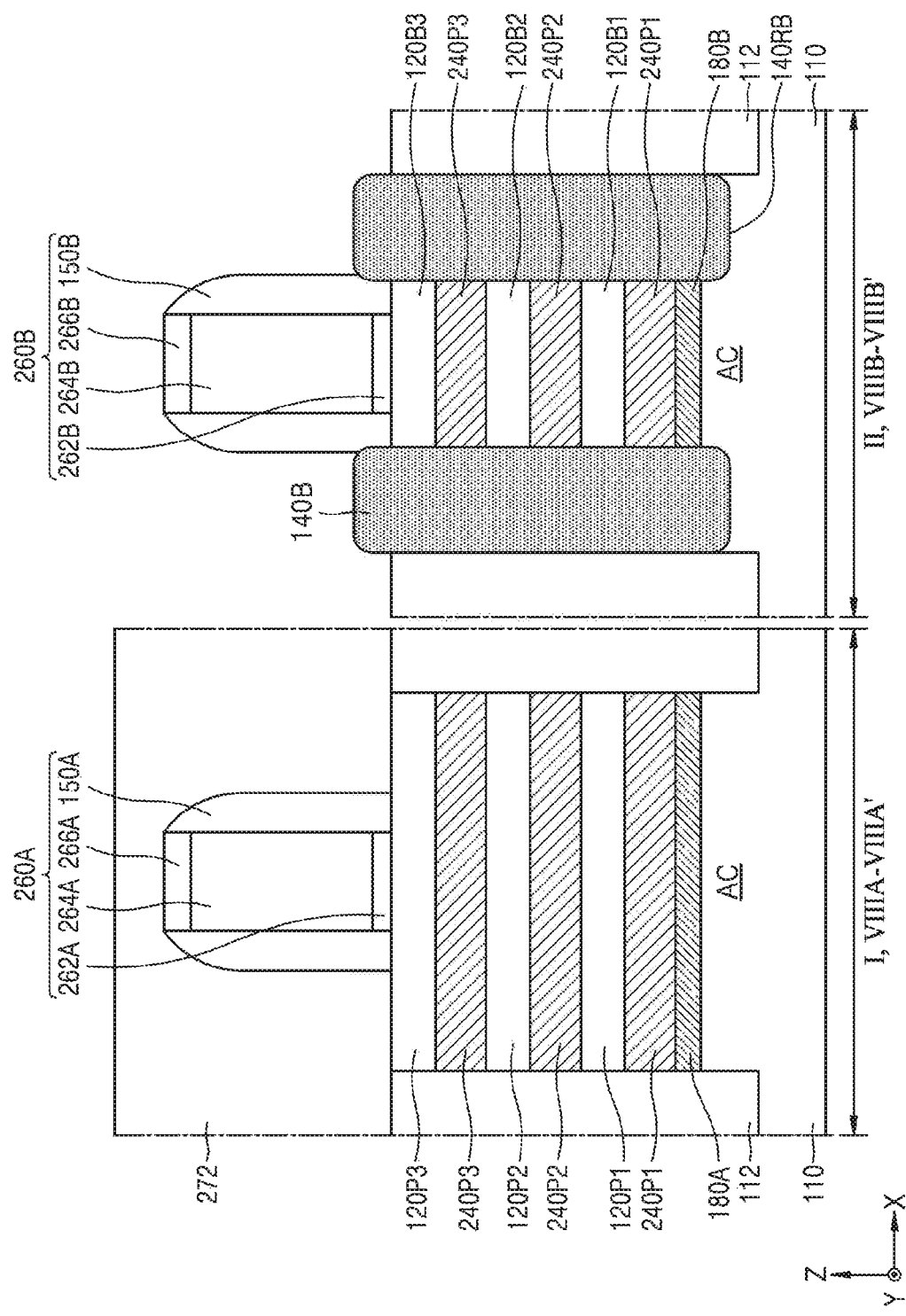
FIG. 16 is a cross-sectional view illustrating a method of manufacturing a semiconductor device according to an example embodiment of the present disclosure.

Referring to FIG. 16, after growing a single-crystal film from the substrate 110, the second nanowires 120B1, 120B2 and 120B3, and the first through third sacrifice layers 240P1, 240P2, and 240P3 in the pair of the second source/drain recess regions 140RB, the pair of the second source/drain regions 140B that fill the pair of the second source/drain recess regions 140RB may be formed.

In an epitaxy process for growing the pair of the second source/drain regions 140B, all of the substrate 110, the second nanowires 120B1, 120B2 and 120B3, and the first through third sacrifice layers 240P1, 240P2, and 240P3 that are exposed on the sidewalls of the pair of the second source/drain recess regions 140RB respectively may be single-crystal semiconductor layers. Accordingly, the generation of dislocations or stacking faults by lattice mismatch in the growing process of the pair of the second source/drain regions 140B may be prevented, and thus, the pair of the second source/drain regions 140B may provide a high crystal quality.

Generally, a seed layer or a template for an epitaxy process may include a single-crystal semiconductor layer having a discontinuous interface or multiple single-crystal semiconductor surfaces separately arranged by an insulating layer. When this happens, there is a high possibility of generating dislocations or stacking faults in the single-crystal semiconductor layer grown on the seed layer or the template. The single-crystal semiconductor layer including the dislocations or stacking faults may hardly function as a stressor that applies compressive strain or tension stress to a channel region.

However, according to the method of manufacturing the semiconductor device 200 according to the present disclosure, all of the substrate 110, the second nanowires 120B1, 120B2 and 120B3, and the first through third sacrifice layers 240P1, 240P2, and 240P3 that are exposed on the sidewalls of the pair of the second source/drain recess regions 140RB may be single-crystal semiconductor layers. In particular, for example, when compared to a case where the insulating layer (or inner-insulating spacers) is exposed on the sidewalls of the pair of the second source/drain recess regions 140RB, the generation of dislocations or stacking faults in the pair of the second source/drain regions 140B growing in the pair of the second source/drain recess regions 140RB may be prevented, and thus, the pair of the second source/drain regions 140B may provide a high crystal quality.

In example embodiments, the second source/drain regions 140B may include multiple layers. For example, the second source/drain regions 140B may include a multi-layer structure in which first and second layers including SiGe may be formed, but the first and second layers respectively may have different contents of Si and Ge, or a multi-layer structure in which first through third layers including SiGe may be formed, but the first through third layers respectively may have different contents of Si and Ge.

Afterwards, the first protection layer 272 may be removed.

Figure 17:
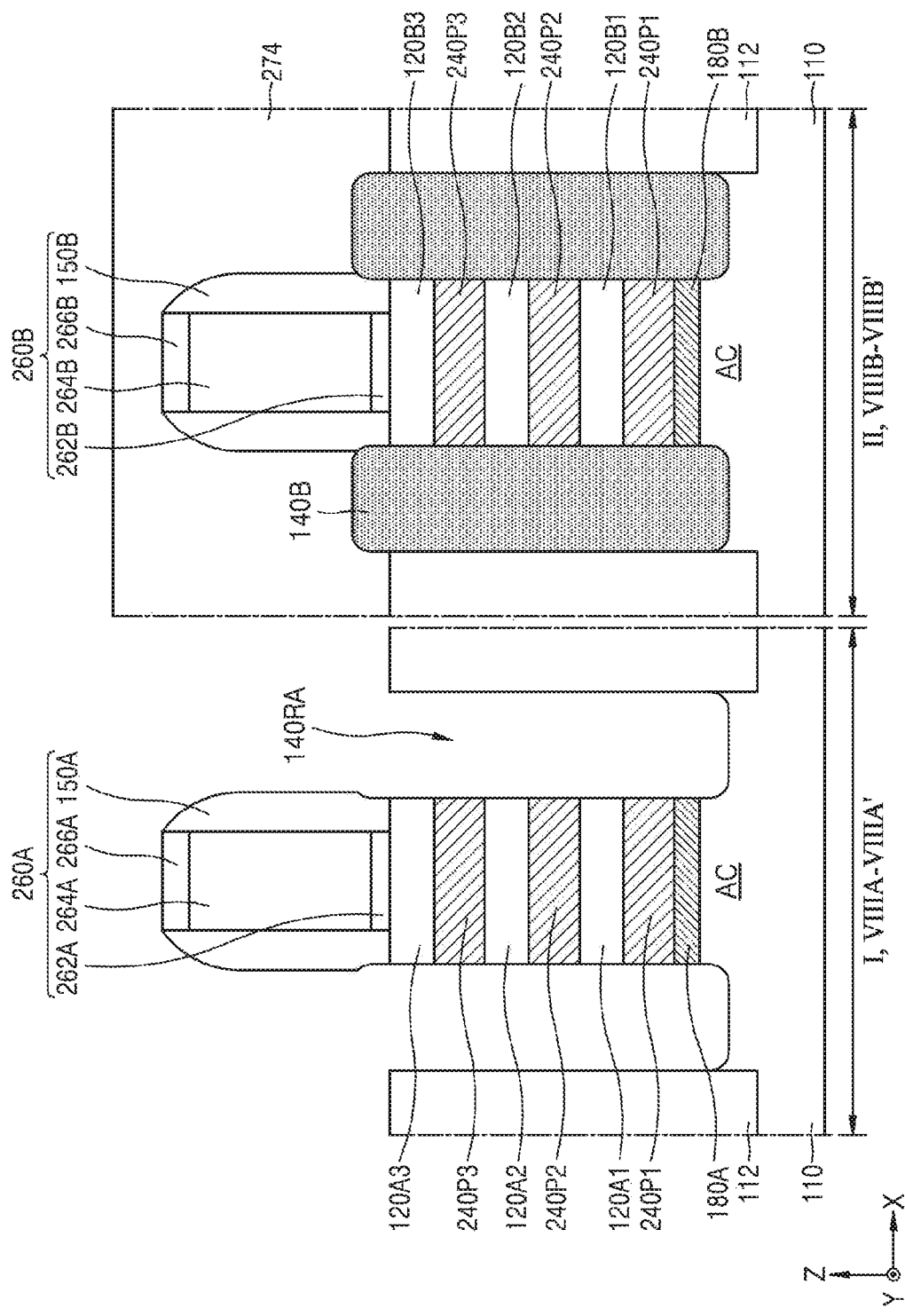
FIG. 17 is a cross-sectional view illustrating a method of manufacturing a semiconductor device according to an example embodiment of the present disclosure.

Referring to FIG. 17, a second protection layer 274 may be formed in the second region II. The pair of the first source/drain recess regions 140RA may be formed by etching parts of the first through third channel layers 120P1, 120P2, and 120P3, the first through third sacrifice layers 240P1, 240P2, and 240P3, the first channel separation region 180A, and the substrate 110 on both sides of the first dummy gate structure 260A using the first dummy gate structure 260A in the first region I as an etch mask.

Figure 18:
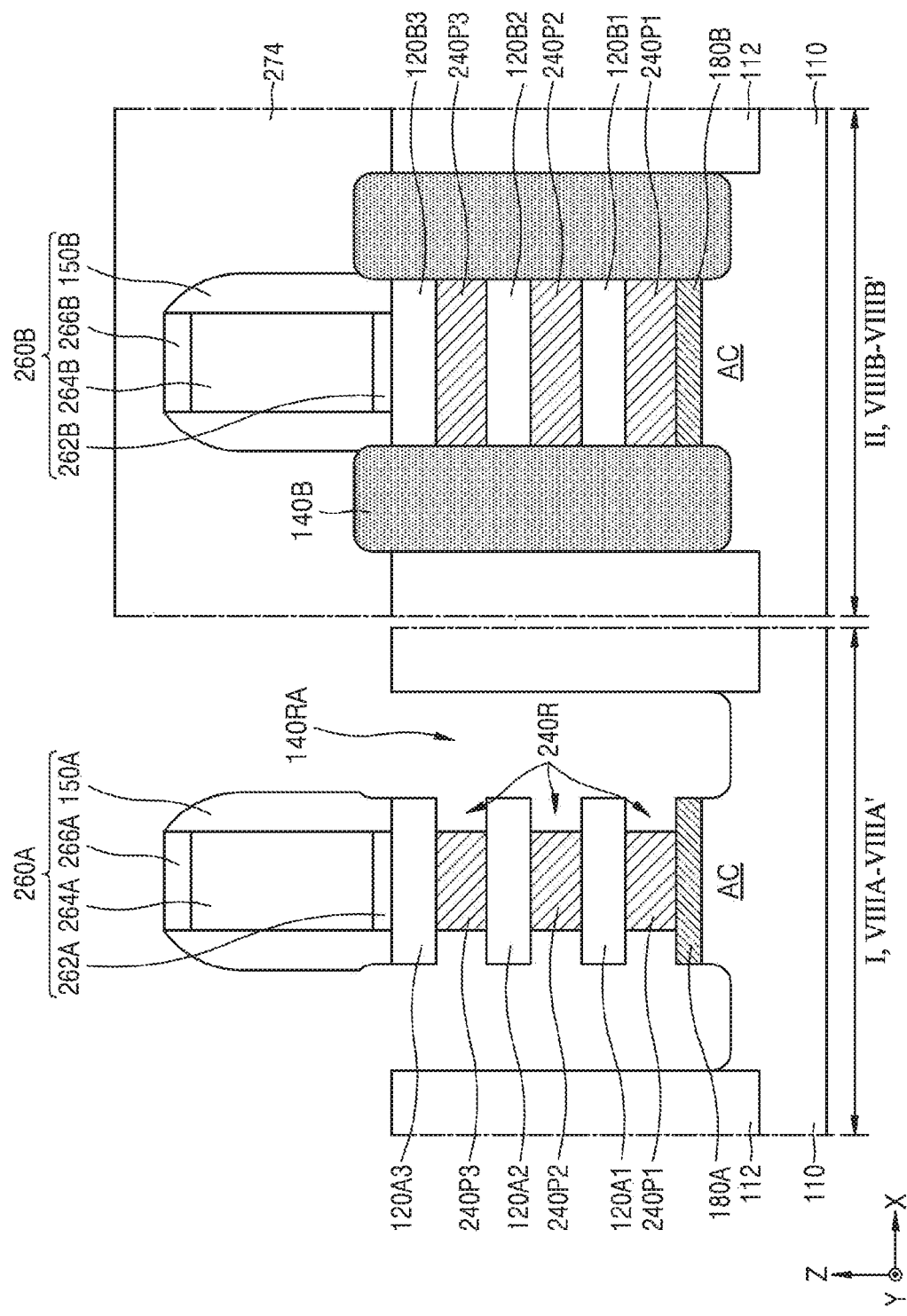
FIG. 18 is a cross-sectional view illustrating a method of manufacturing a semiconductor device according to an example embodiment of the present disclosure.

Referring to FIG. 18, sacrifice recess regions 240R may be formed by laterally etching parts of the first through third sacrifice layers 240P1, 240P2, and 240P3 exposed by the pair of the first source/drain recess regions 140RA.

In example embodiments, an etch condition may exist in which first through third sacrifice layers 240P1, 240P2, and 240P3 have a high etch rate with respect to the first through third channel layers 120P1, 120P2, and 120P3. The sacrifice recess regions 240R may be formed by removing a predetermined thickness of the first through third sacrifice layers 240P1, 240P2, and 240P3 exposed on the sidewalls of the pair of the first source/drain recess regions 140RA based on the etch condition. As depicted in FIG. 18, the sacrifice recess regions 240R may have a vertical sidewall profile, and unlike this, as depicted in FIG. 11, may have a concave sidewall profile.

Figure 19:
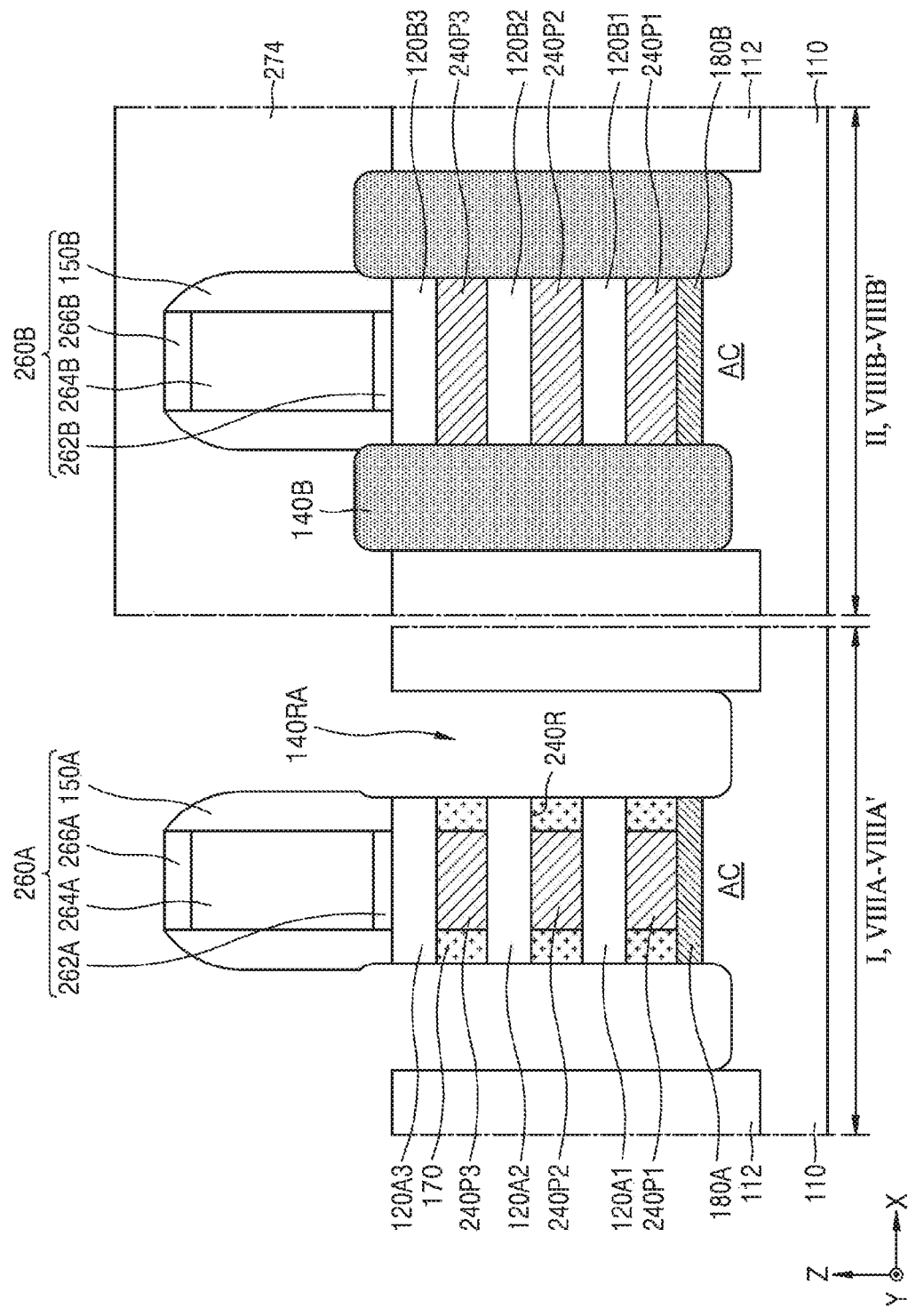
FIG. 19 is a cross-sectional view illustrating a method of manufacturing a semiconductor device according to an example embodiment of the present disclosure.

Referring to FIG. 19, after filling inner sides of the sacrifice recess regions 240R by forming a conforming insulating layer (not shown) on sidewalls of the pair of the first source/drain recess regions 140RA, the inner-insulating spacers 170 may be only remain in the inner side of the sacrifice recess regions 240R using an etch-back process.

Figure 20:
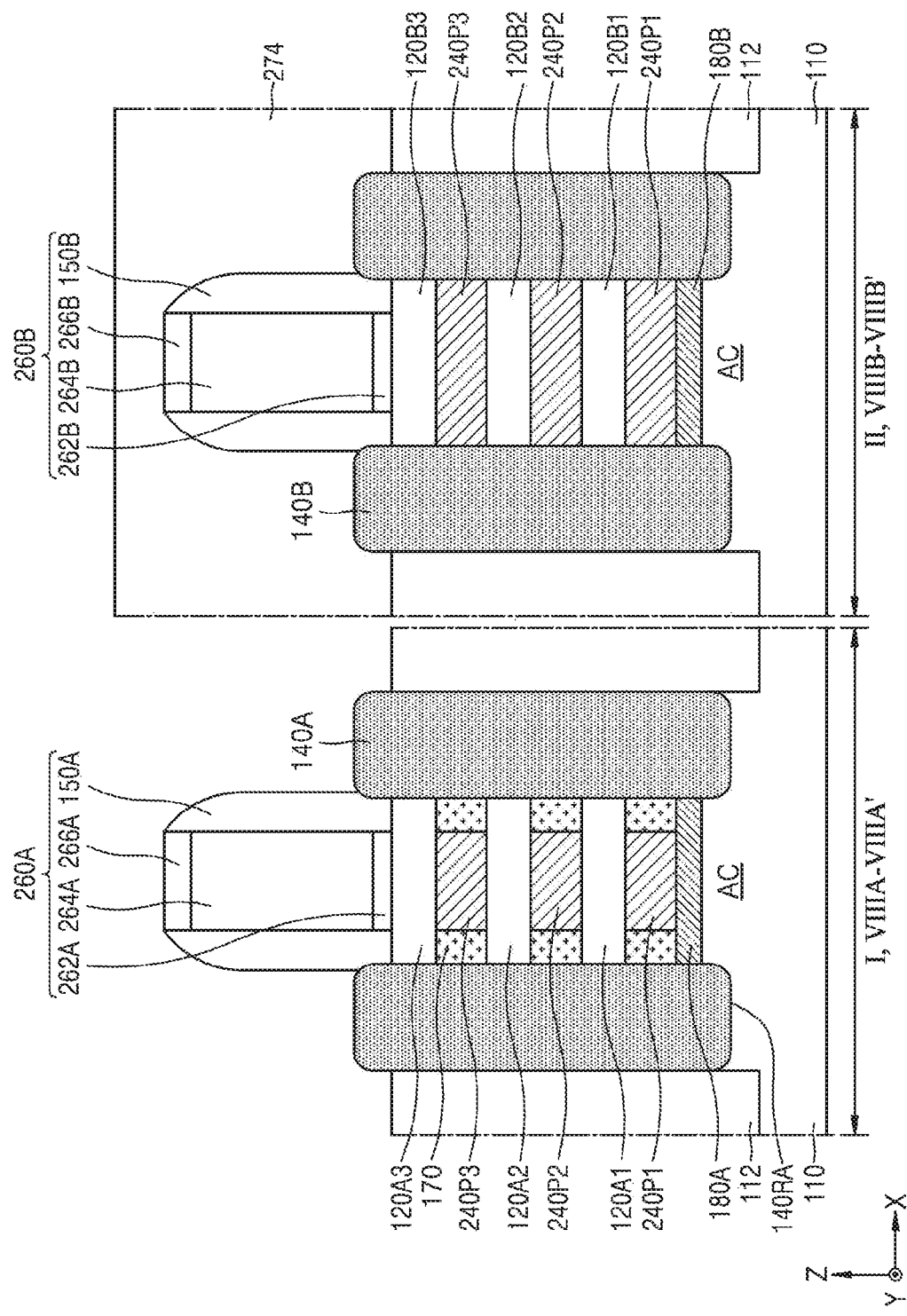
FIG. 20 is a cross-sectional view illustrating a method of manufacturing a semiconductor device according to an example embodiment of the present disclosure.

Referring to FIG. 20, the pair of the first source/drain regions 140A that fill the pair of the first source/drain recess regions 140RA may be formed in the pair of the first source/drain recess regions 140RA by re-growing single-crystal layers from the substrate 110 and the first nanowires 120A1, 120A2 and 120A3.

Figure 21:
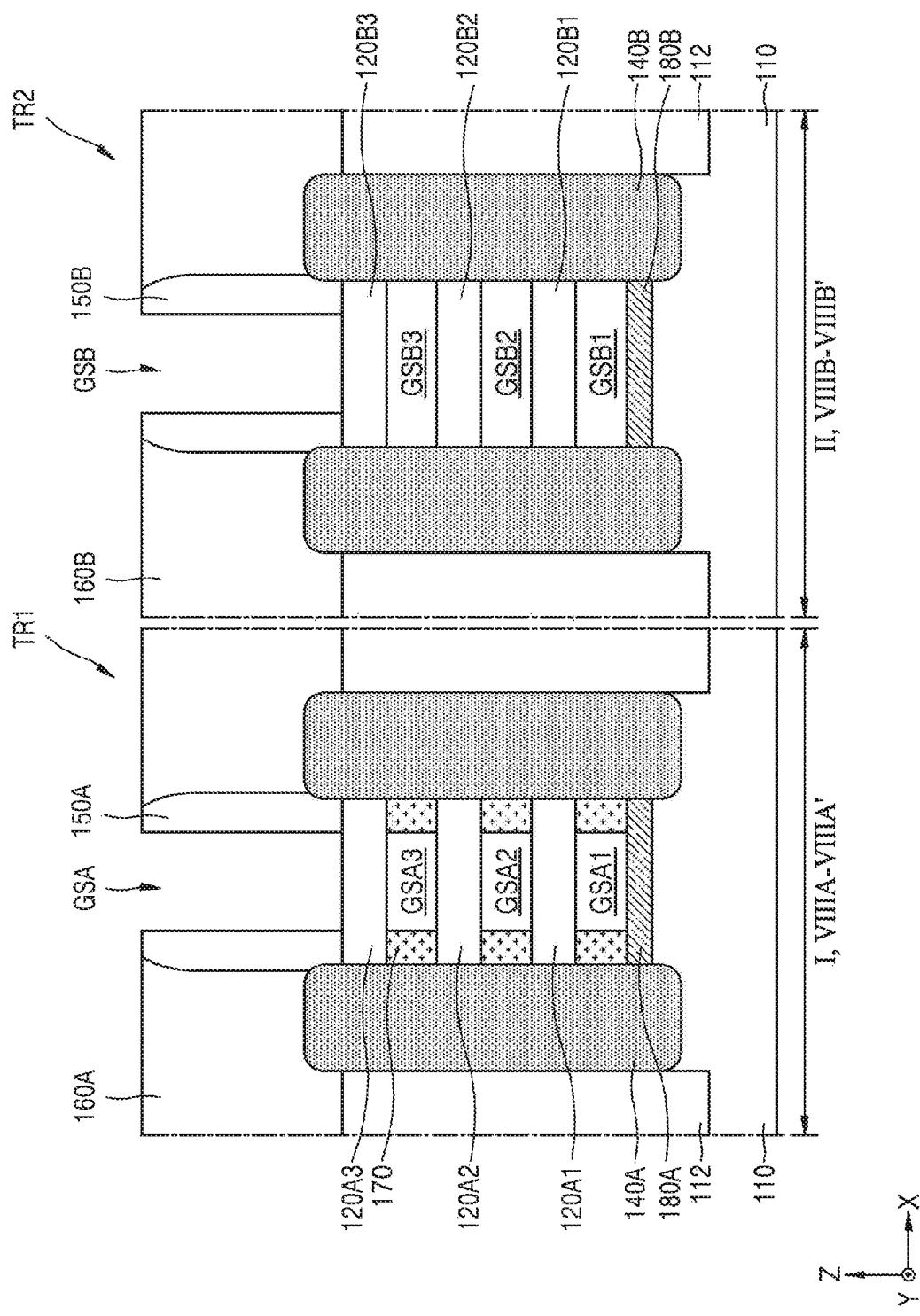
FIG. 21 is a cross-sectional view illustrating a method of manufacturing a semiconductor device according to an example embodiment of the present disclosure.

Referring to FIG. 21, the second protection layer 274 (refer to FIG. 20) may be removed.

Afterwards, after forming insulating layers 160A and 160B on the isolation layer 112, the first dummy gate structure 260A and second dummy gate structure 260B (refer to FIG. 20), and the pair of the first source/drain region 140A and second source/drain region 140B, upper parts of the insulating layers 160A and 160B are removed using a planarizing process of an etch-back process, and as a result, the first dummy gate structure 260A and second dummy gate structure 260B may be exposed to the outside. Afterwards, the first dummy gate structure 260A and second dummy gate structure 260B are removed to have first gate space GSA and second gate space GSB between the pair of external insulating spacers 150A and 150B. The first nanowires 120A1, 120A2 and 120A3 may be exposed through the first gate space GSA, and the second nanowires 120B1, 120B2 and 120B3 may be exposed through the second gate space GSB.

Afterwards, the first gate space GSA and second gate space GSB may extend to an upper surface of the substrate 110 by selectively removing parts of the first through third sacrifice layers 240P1, 240P2, and 240P3 exposed through the first gate space GSA and second gate space GSB.

For example, first sub-gate spaces GSA1, GSA2, and GSA3 may be formed on locations where the first through third sacrifice layers 240P1, 240P2, and 240P3 are removed in the first region I, and second sub-gate spaces GSB1, GSB2, and GSB3 may be formed on locations where the first through third sacrifice layers 240P1, 240P2, and 240P3 are removed in the second region II.

Referring to FIG. 20 and FIG. 8, the first gate dielectric layer 232A and second gate dielectric layer 232B respectively are formed on surfaces exposed in the first gate space GSA and second gate space GSB. That is, the first gate dielectric layer 232A and second gate dielectric layer 232B respectively are formed on exposed surfaces of each of the first nanowires 120A1, 120A2 and 120A3, the second nanowires 120B1, 120B2 and 120B3, and the first channel separation region 180A and second channel separation region 180B, exposed surfaces of the inner-insulating spacers 170, and exposed surfaces of the pair of the first external insulating spacer 150A and second external insulating spacer 150B. Afterwards, the first gate electrode 230A and second gate electrode 230B that fill the first space GSA and second gate space GSB respectively may be formed on the first gate dielectric layer 232A and second gate dielectric layer 232B.

In the semiconductor device 200 manufactured according to the method described above, the first transistor TR1, for example, an NMOS transistor may provide a high performance since a parasitic capacitance generated in the inner-insulating spacers 170 is reduced, and the second transistor TR2 may provide a high performance by a high crystal quality of the pair of the second source/drain regions 140B.

Example embodiments of the present disclosure have been described with reference to the accompanying drawings. In the current specification, the example embodiments are described by using specific terms. However, it should be understood that the terms are used to explain the technical scope of the concepts described herein are not to limit the scope of the features, characteristics and concepts described in the claims. Therefore, it will be understood by those of ordinary skill in the art that various changes in form and details may be made therein without departing from the spirit and scope of the present disclosure. Therefore, the scope of the present disclosure is defined not by the detailed description above but by the appended claims.

What is claimed is:

1. A semiconductor device, comprising:
a first transistor in a first region of a substrate and a second transistor in a second region of the substrate,
wherein the first transistor comprises:
a plurality of first channel regions spaced apart from each other in a first direction perpendicular to a top surface of the substrate;
a first gate electrode surrounding the plurality of first channel regions;
a first external insulating spacer on upper sidewalls of the first gate electrode,
a first source/drain region connected to an edge of the plurality of first channel regions, the first source/drain region contacting the first external insulating spacer, the first source/drain region having a top surface at a level higher than a top surface of an uppermost first channel region; and
a plurality of inner-insulating spacers between the first gate electrode and the first source/drain region and between two adjacent first channel regions of the plurality of first channel regions, the plurality of inner-insulating spacers having a curved sidewall facing the first gate electrode, and
the second transistor comprises:
a plurality of second channel regions spaced apart from each other in the first direction;
a second gate electrode surrounding the plurality of second channel regions;
a second external insulating spacer on upper sidewalls of the second gate electrode; and
a second source/drain region connected to an edge of the plurality of second channel regions, the second source/drain region contacting the second external insulating spacer, the second source/drain region having a top surface at a level higher than a top surface of an uppermost second channel region, the second source/drain region including a plurality of protrusion portions facing the second gate electrode, the plurality of protrusion portions being disposed between two adjacent second channel regions of the plurality of second channel regions.

2. The semiconductor device of claim 1, further comprising:
a first gate dielectric layer between the first gate electrode and the plurality of first channel regions; and
a second gate dielectric layer between the second gate electrode and the plurality of second channel regions.

3. The semiconductor device of claim 2, wherein the first gate dielectric layer extends between the first gate electrode and the plurality of inner-insulating spacers.

4. The semiconductor device of claim 2, wherein the first source/drain region is not in contact with the first gate dielectric layer, and
the second source/drain region contacts the second gate dielectric layer.

5. The semiconductor device of claim 2, wherein the plurality of protrusion portions contact the second gate dielectric layer.

6. The semiconductor device of claim 2, wherein the plurality of inner-insulating spacers comprises a first material having a first dielectric constant, and the first gate dielectric layer comprises a second material having a second dielectric constant greater than the first dielectric constant.

7. The semiconductor device of claim 6, wherein the first external insulating spacer comprises a third material that is different from the first material.

8. The semiconductor device of claim 7, wherein the first external insulating spacer comprises at least one of silicon oxide, silicon oxynitride, or silicon nitride.

9. The semiconductor device of claim 1, wherein the first transistor is an n-type metal-oxide-semiconductor (NMOS) transistor, and the second transistor is a p-type metal-oxide-semiconductor (PMOS) transistor.

10. The semiconductor device of claim 1, wherein the first external insulating spacer and the plurality of inner-insulating spacers overlap and are located over the substrate at different levels from each other in the first direction, and
the second external insulating spacer and the second gate electrode overlap and are located over the substrate at different levels from each other in the first direction.

11. A semiconductor device, comprising:
a first transistor in a first region of a substrate and a second transistor in a second region of the substrate,
wherein the first transistor comprises:
a plurality of first channel regions spaced apart from each other in a first direction perpendicular to a top surface of the substrate;
a first gate electrode surrounding the plurality of first channel regions;
a first external insulating spacer on upper sidewalls of the first gate electrode,
a first source/drain region connected to an edge of the plurality of first channel regions, the first source/drain region contacting the first external insulating spacer, the first source/drain region having a top surface at a level higher than a top surface of an uppermost first channel region; and
a plurality of inner-insulating spacers between the first gate electrode and the first source/drain region and between two adjacent first channel regions of the plurality of first channel regions, the plurality of inner-insulating spacers having a curved sidewall facing the first gate electrode, and
the second transistor comprises:
a plurality of second channel regions spaced apart from each other in the first direction;
a second gate electrode surrounding the plurality of second channel regions;
a second external insulating spacer on upper sidewalls of the second gate electrode; and
a second source/drain region connected to an edge of the plurality of second channel regions, the second source/drain region contacting the second external insulating spacer, the second source/drain region having a top surface at a level higher than a top surface of an uppermost second channel region.

12. The semiconductor device of claim 11, further comprising:
a first gate dielectric layer between the first gate electrode and the plurality of first channel regions; and
a second gate dielectric layer between the second gate electrode and the plurality of second channel regions.

13. The semiconductor device of claim 12, wherein the first source/drain region is not in contact with the first gate dielectric layer, and
the second source/drain region contacts the second gate dielectric layer.

14. The semiconductor device of claim 12, wherein the second source/drain region includes a plurality of protrusion portions facing the second gate electrode, and the plurality of protrusion portions contact the second gate dielectric layer.

15. The semiconductor device of claim 11, wherein the first external insulating spacer comprises at least one of silicon oxide, silicon oxynitride, or silicon nitride, and
the second external insulating spacer comprises at least one of silicon oxide, silicon oxynitride, or silicon nitride.

16. A semiconductor device, comprising:
a first transistor in a first region of a substrate and a second transistor in a second region of the substrate,
wherein the first transistor comprises:
a plurality of first channel regions spaced apart from each other in a first direction perpendicular to a top surface of the substrate;
a first gate electrode surrounding the plurality of first channel regions;
a first external insulating spacer on upper sidewalls of the first gate electrode,
a first source/drain region connected to an edge of the plurality of first channel regions; and
a plurality of inner-insulating spacers between the first gate electrode and the first source/drain region and between two adjacent first channel regions of the plurality of first channel regions, the plurality of inner-insulating spacers having a curved sidewall facing the first gate electrode, and
the second transistor comprises:
a plurality of second channel regions spaced apart from each other in the first direction;
a second gate electrode surrounding the plurality of second channel regions;
a second external insulating spacer on upper sidewalls of the second gate electrode; and
a second source/drain region connected to an edge of the plurality of second channel regions, the second source/drain region including a plurality of protrusion portions facing the second gate electrode, the plurality of protrusion portions being disposed between two adjacent second channel regions of the plurality of second channel regions.

17. The semiconductor device of claim 16, further comprising:
a first gate dielectric layer between the first gate electrode and the plurality of first channel regions; and
a second gate dielectric layer between the second gate electrode and the plurality of second channel regions.

18. The semiconductor device of claim 17, wherein the first source/drain region is not in contact with the first gate dielectric layer, and
the second source/drain region contacts the second gate dielectric layer.

19. The semiconductor device of claim 17, wherein the plurality of protrusion portions contact the second gate dielectric layer.

20. The semiconductor device of claim 16, wherein the first external insulating spacer and the plurality of inner-insulating spacers overlap and are located over the substrate at different levels from each other in the first direction, and
the second external insulating spacer and the second gate electrode overlap and are located over the substrate at different levels from each other in the first direction.

* * * * *